US010784075B2

(12) United States Patent
Hisada et al.

(10) Patent No.: US 10,784,075 B2
(45) Date of Patent: Sep. 22, 2020

(54) ION BEAM IRRADIATION APPARATUS

(71) Applicant: NISSIN ION EQUIPMENT CO., LTD., Kyoto-shi, Kyoto (JP)

(72) Inventors: Shinya Hisada, Kyoto (JP); Kohei Tanaka, Kyoto (JP); Shigehisa Tamura, Kyoto (JP); Makoto Nakaya, Kyoto (JP)

(73) Assignee: NISSIN ION EQUIPMENT CO., LTD., Kyoto-shi (JP)

(*) Notice: Subject to any disclaimer, the term of this patent is extended or adjusted under 35 U.S.C. 154(b) by 0 days.

(21) Appl. No.: 16/655,012

(22) Filed: Oct. 16, 2019

(65) Prior Publication Data
US 2020/0051776 A1    Feb. 13, 2020

Related U.S. Application Data

(63) Continuation-in-part of application No. 15/585,562, filed on May 3, 2017, now abandoned, which is a continuation-in-part of application No. 14/067,477, filed on Oct. 30, 2013, now abandoned.

(30) Foreign Application Priority Data

Feb. 22, 2013  (JP) .................................. 2013-33214

(51) Int. Cl.
*H01J 37/36* (2006.01)
*H01J 37/20* (2006.01)
*H01J 37/18* (2006.01)

(52) U.S. Cl.
CPC .............. *H01J 37/20* (2013.01); *H01J 37/18* (2013.01); *H01J 2237/20214* (2013.01); *H01J 2237/20221* (2013.01)

(58) Field of Classification Search
CPC ........ H01J 37/20; H01J 37/18; H01J 37/3171; H01J 2237/20221; H01J 2237/022; H01J 2237/1825; H01J 2237/20214
See application file for complete search history.

(56) References Cited

U.S. PATENT DOCUMENTS

| 4,383,178 A | 5/1983 | Shibata et al. |
| 5,963,027 A | 10/1999 | Peters |
| 6,566,661 B1 | 5/2003 | Mitchell |

(Continued)

FOREIGN PATENT DOCUMENTS

| JP | 2000018832 A | 1/2000 |
| JP | 2002305230 A | 10/2002 |
| JP | 2011187393 A | 9/2011 |

*Primary Examiner* — Yuechuan Yu
(74) *Attorney, Agent, or Firm* — Procopio, Cory, Hargreaves & Savitch LLP

(57) ABSTRACT

An apparatus provided with a wafer processing chamber that houses a wafer supporting mechanism supporting a wafer and is used to irradiate the wafer supported by the wafer supporting mechanism with an ion beam and a transport mechanism housing chamber that houses a transport mechanism provided underneath the wafer processing chamber and used for moving the wafer supporting mechanism in a substantially horizontal direction, wherein an aperture used for moving the wafer supporting mechanism along with a coupling member coupling the wafer supporting mechanism to the transport mechanism is formed in the direction of movement of the transport mechanism in a partition wall separating the wafer processing chamber from the transport mechanism housing chamber.

18 Claims, 21 Drawing Sheets

(56) References Cited

U.S. PATENT DOCUMENTS

| | | |
|---|---|---|
| 2006/0054278 A1 | 3/2006 | Makino et al. |
| 2006/0156979 A1 | 7/2006 | Thakur et al. |
| 2006/0182534 A1 | 8/2006 | Hiroki |
| 2009/0255362 A1 | 10/2009 | Barker et al. |

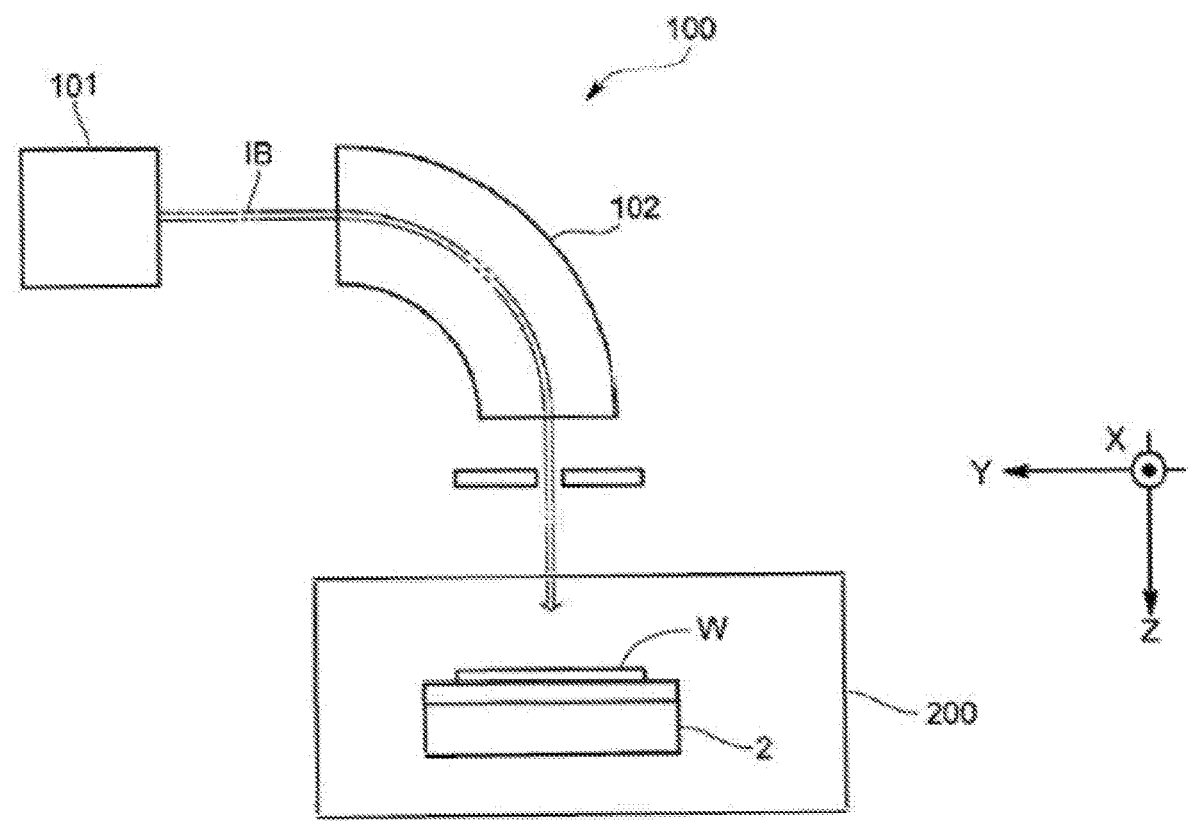
[FIG. 1]

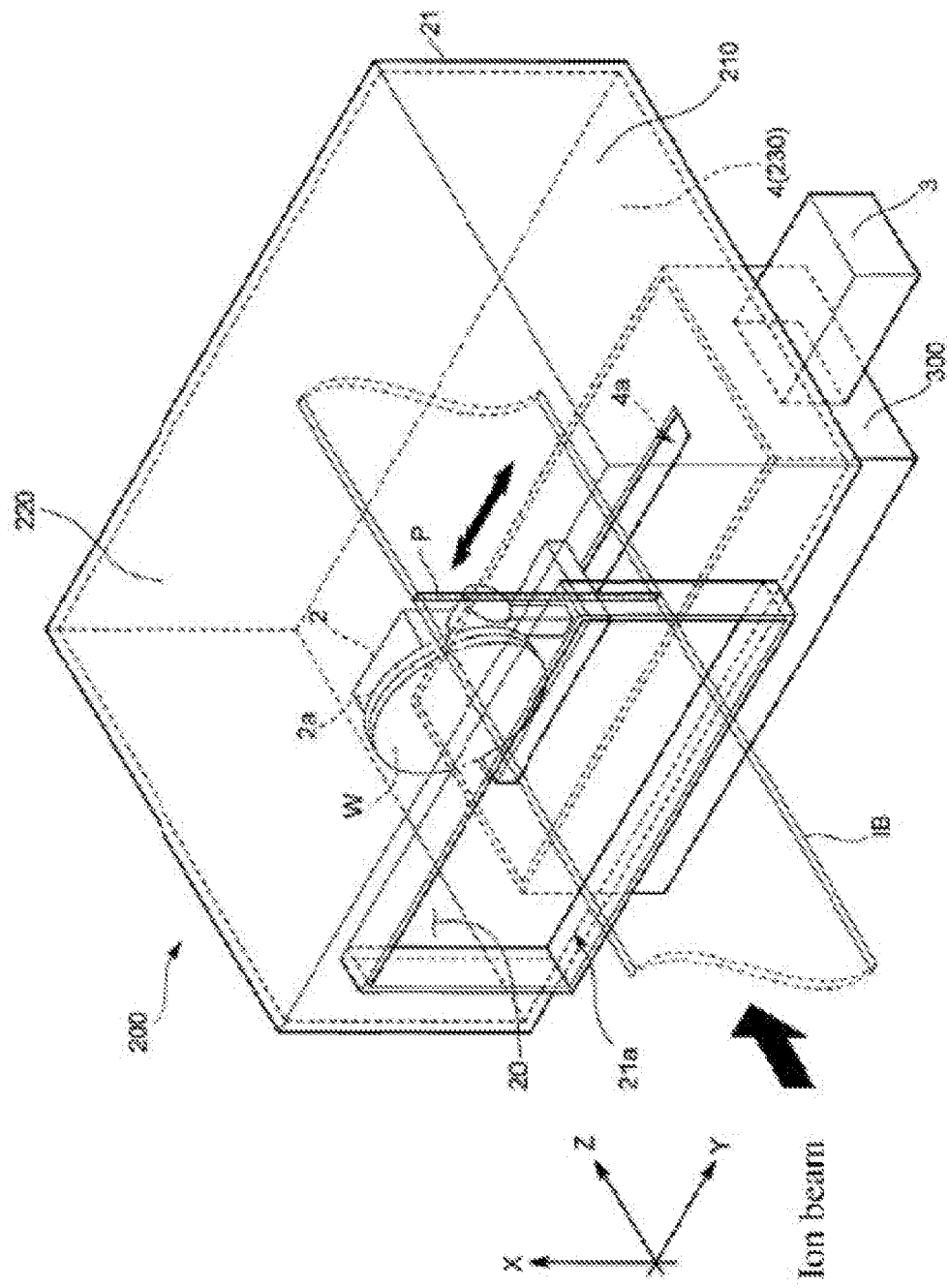
[FIG. 2]

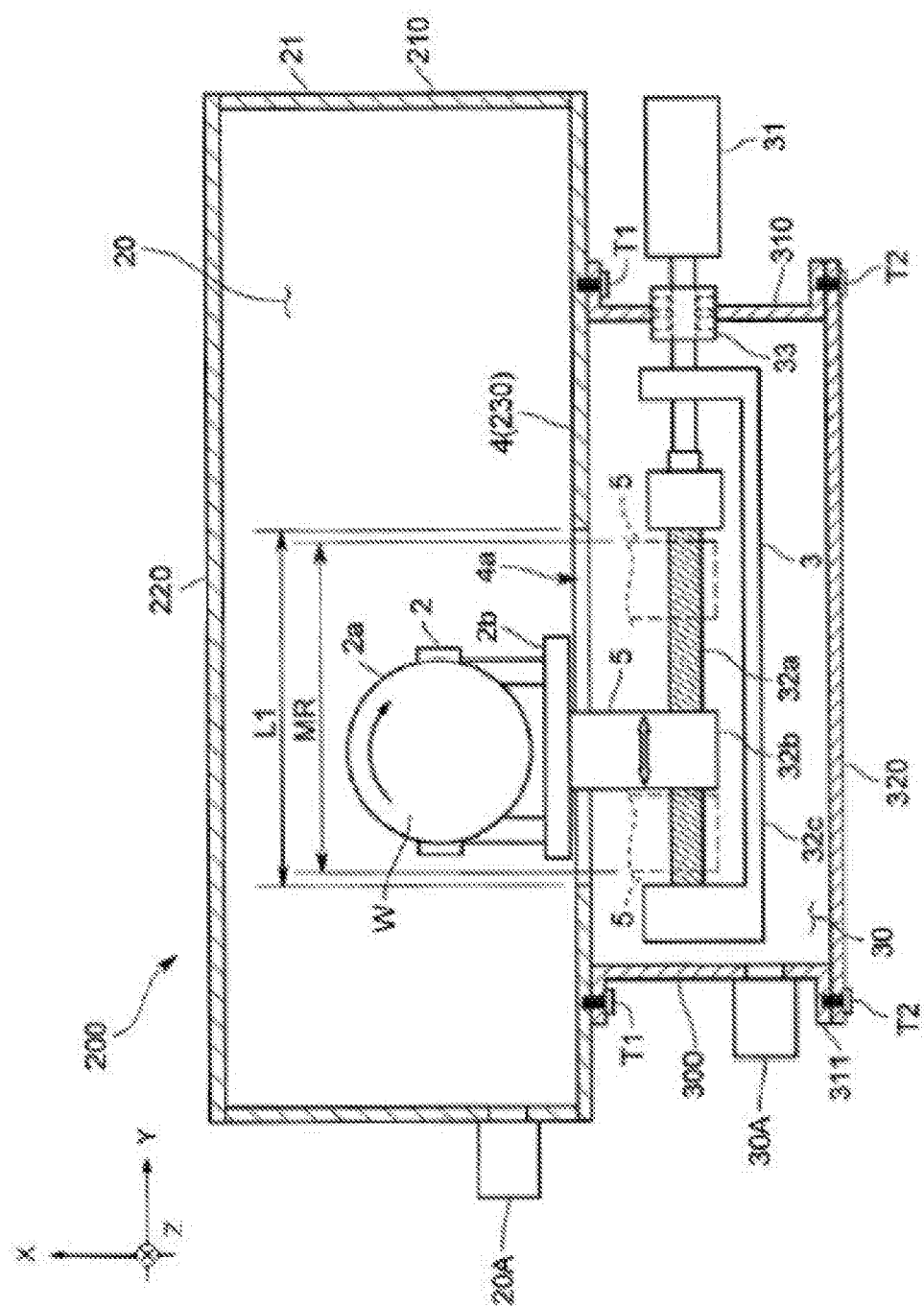
[FIG. 3]

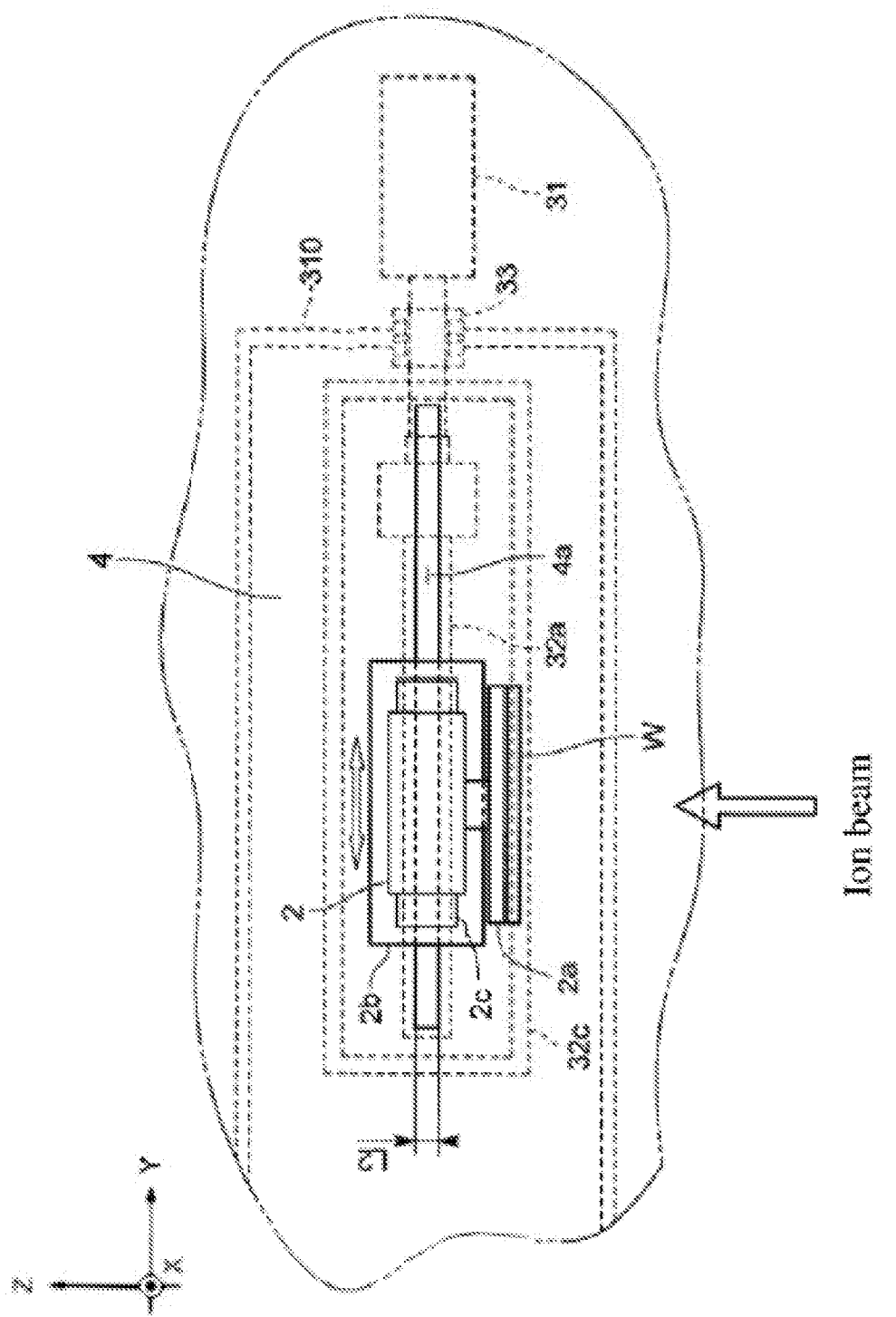
[FIG. 4]

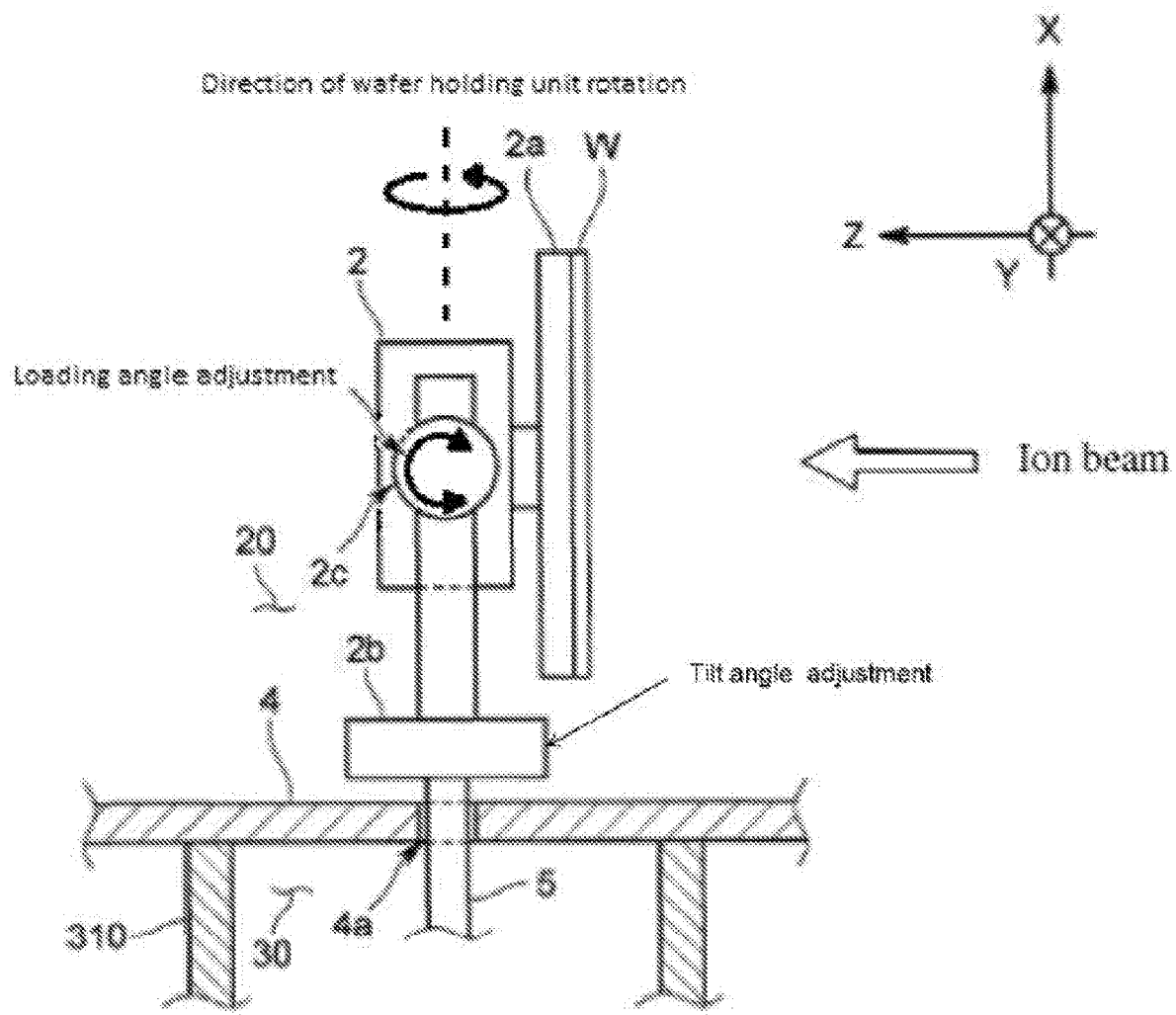
[FIG. 5A]

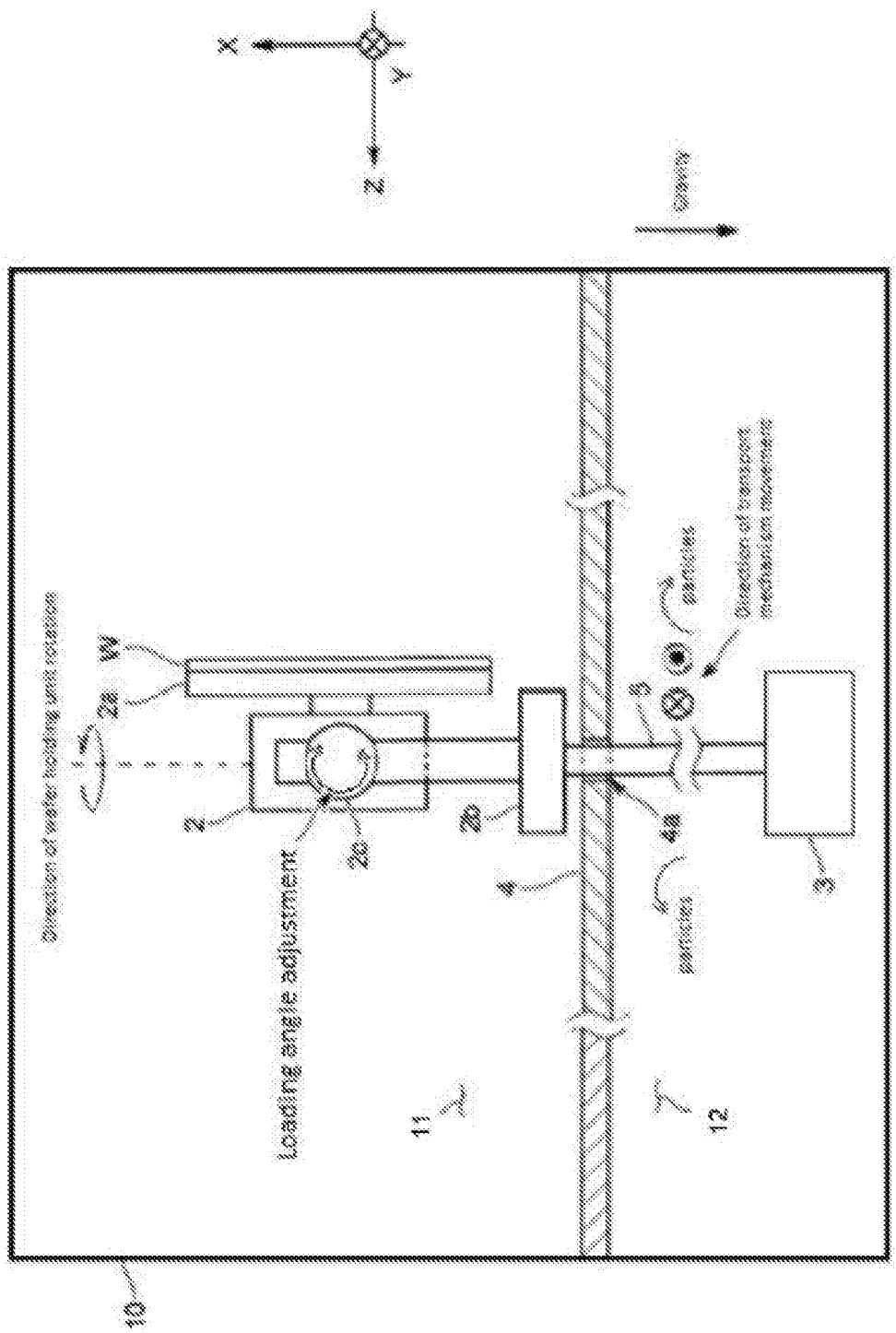
[FIG. 5B]

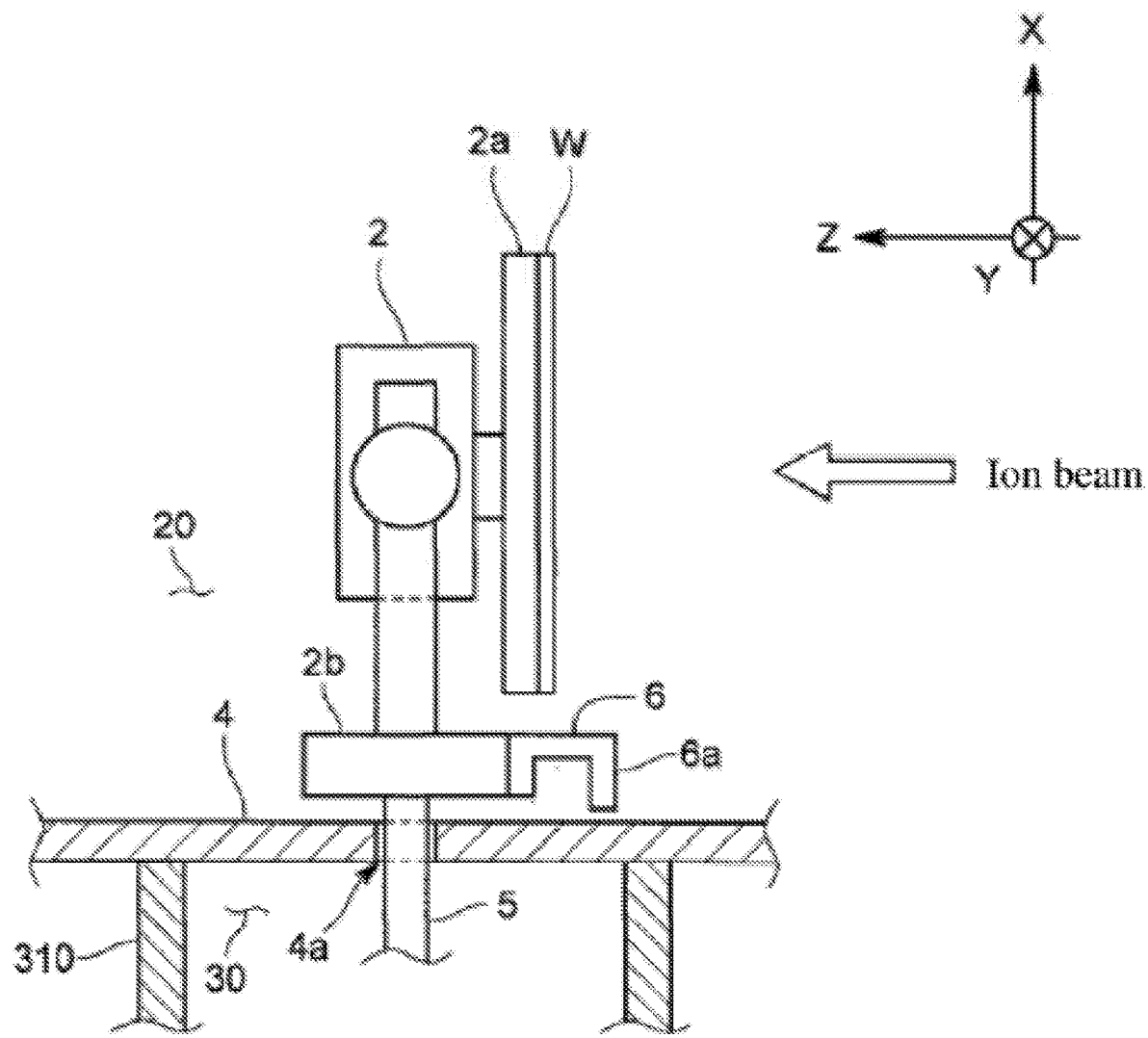
[FIG. 6]

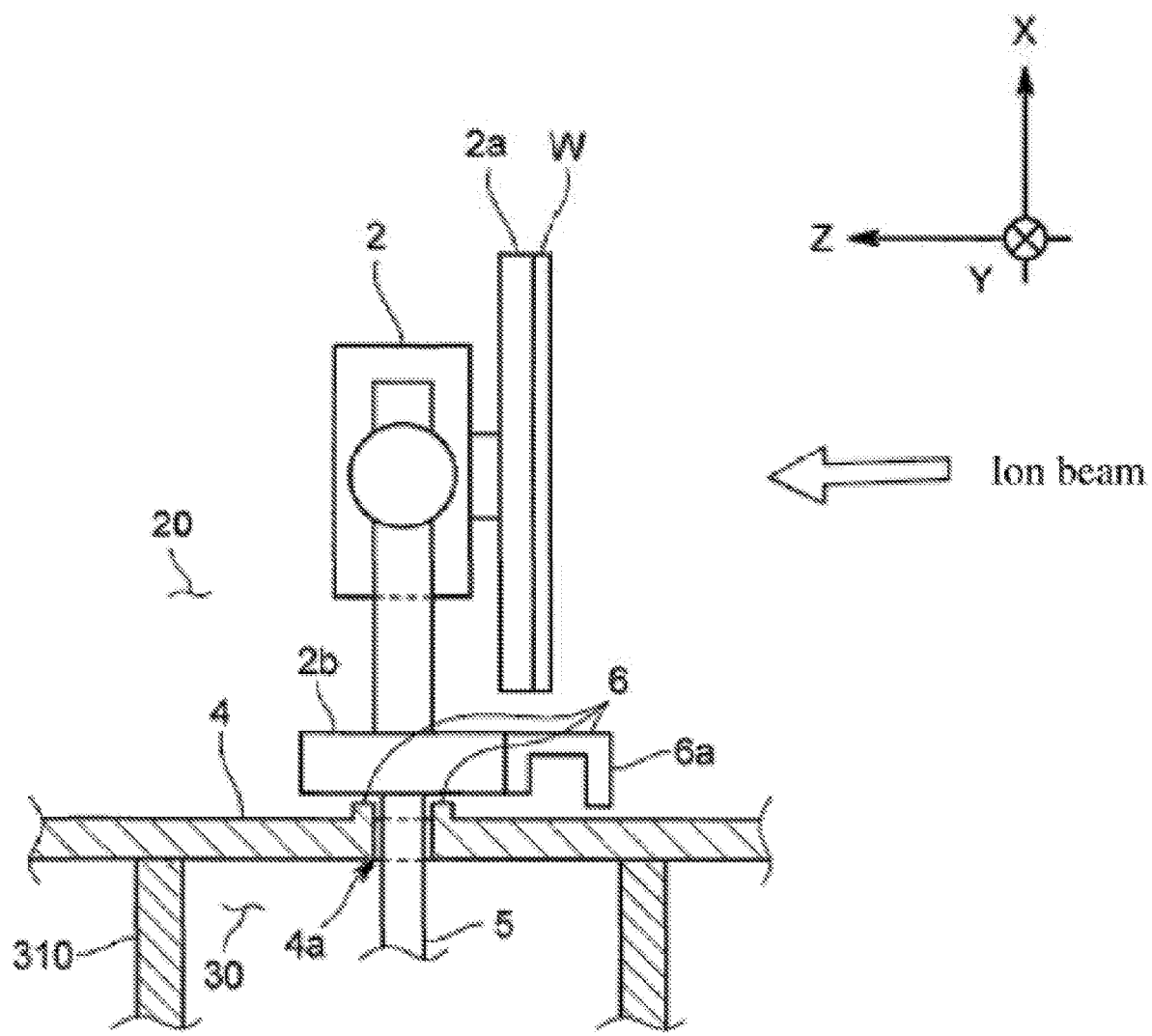
[FIG. 7]

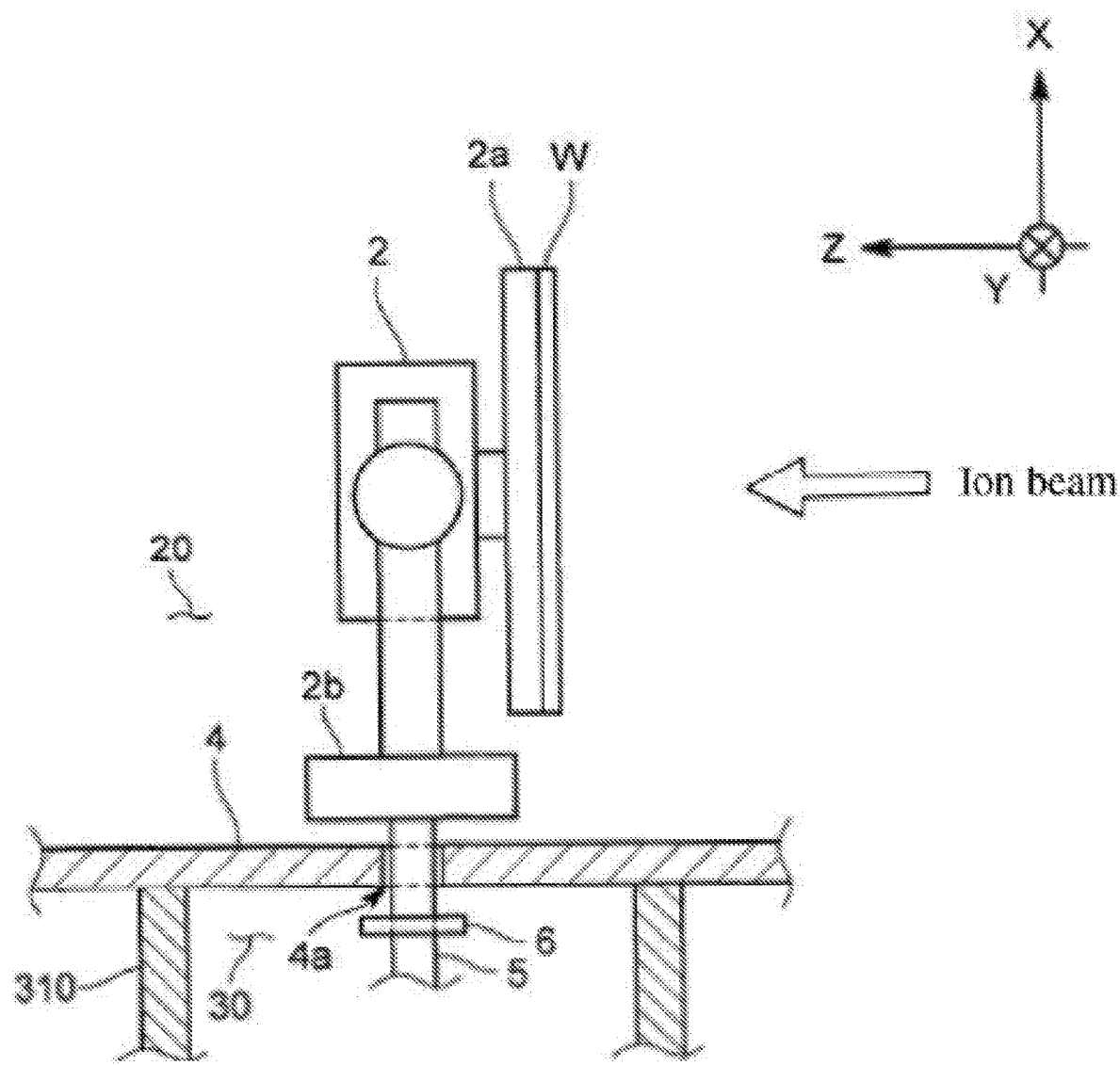
[FIG. 8]

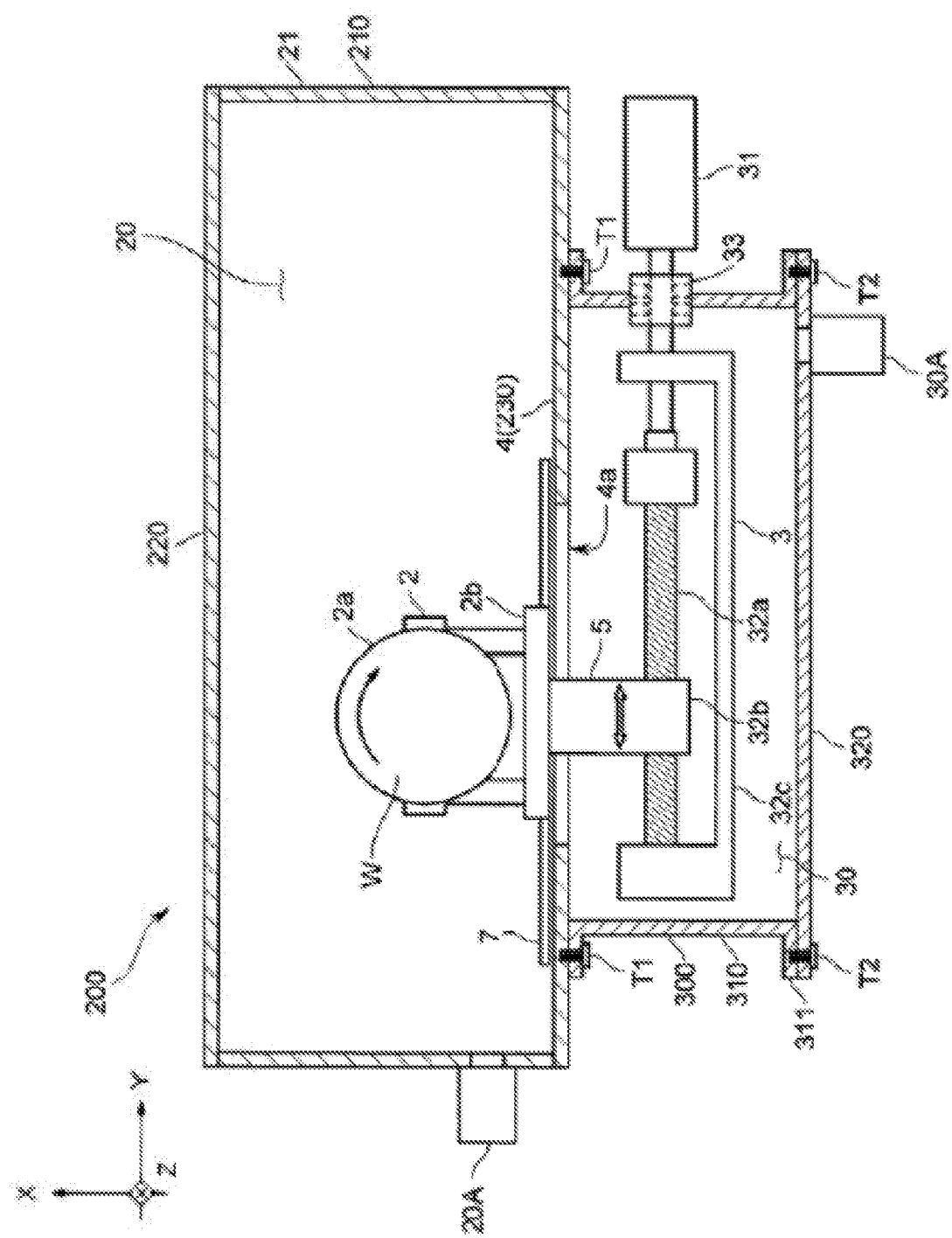
[FIG. 9]

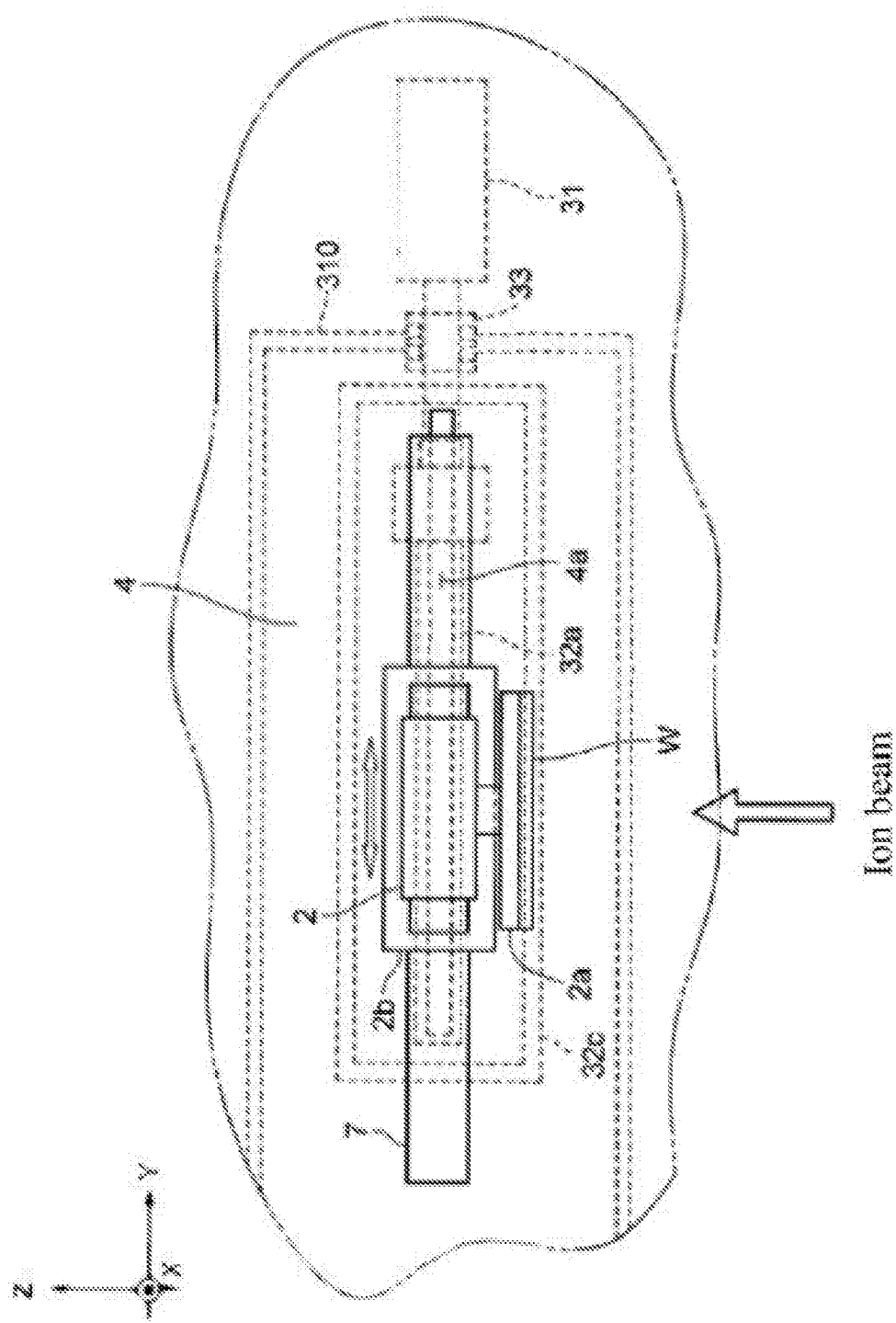
[FIG. 10]

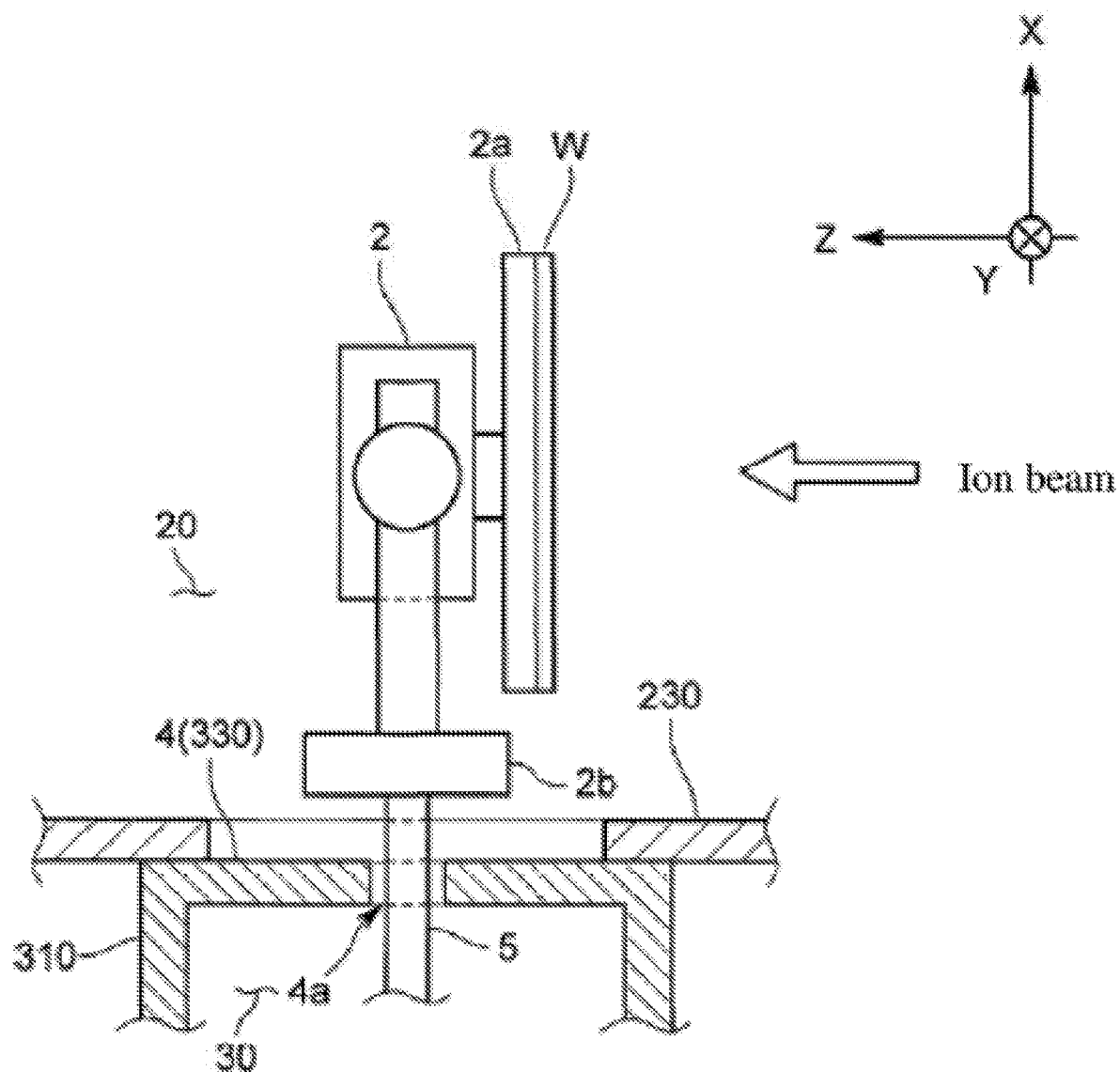
[FIG. 11]

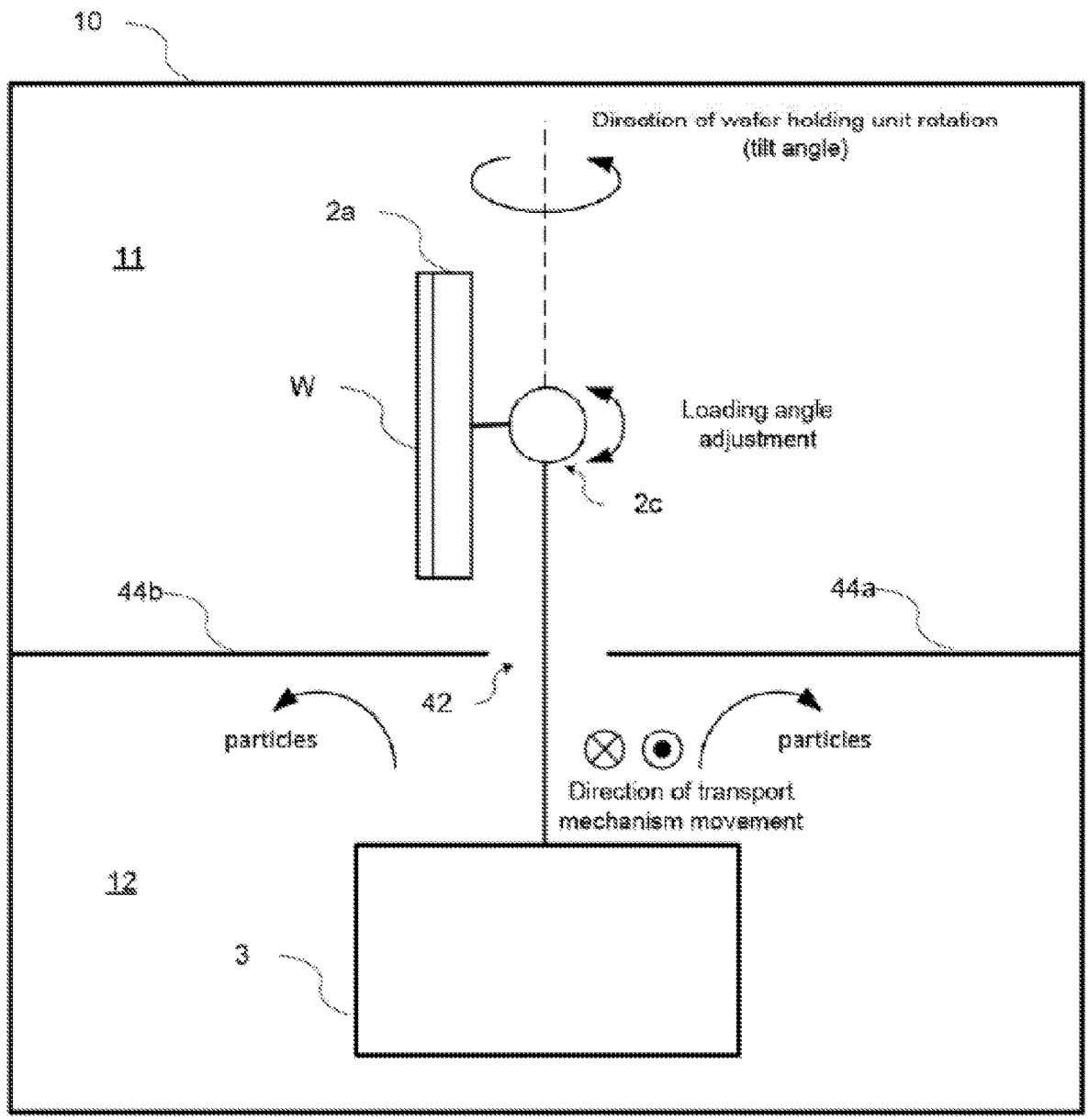
[FIG. 12A]

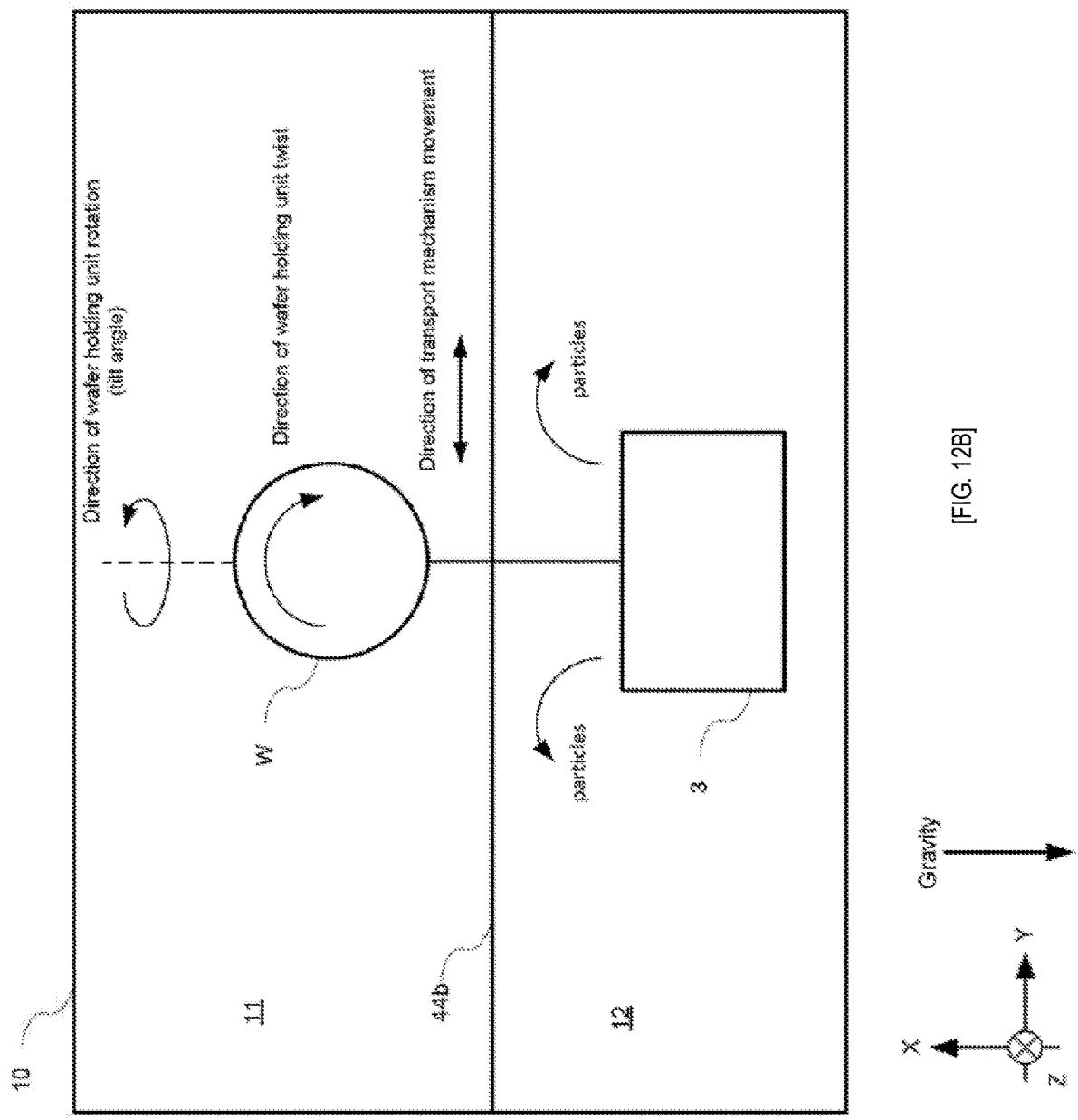
[FIG. 12B]

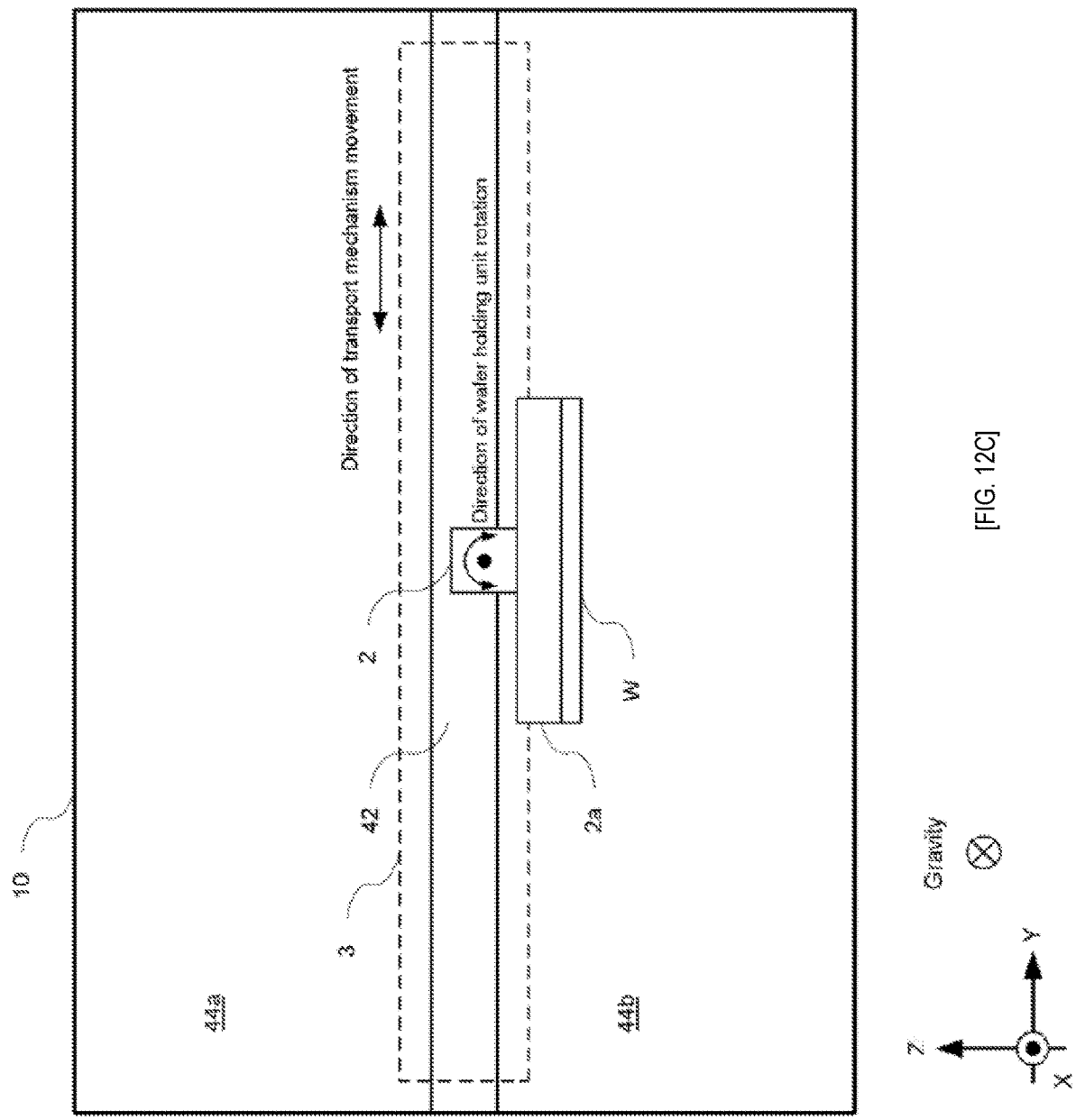
[FIG. 12C]

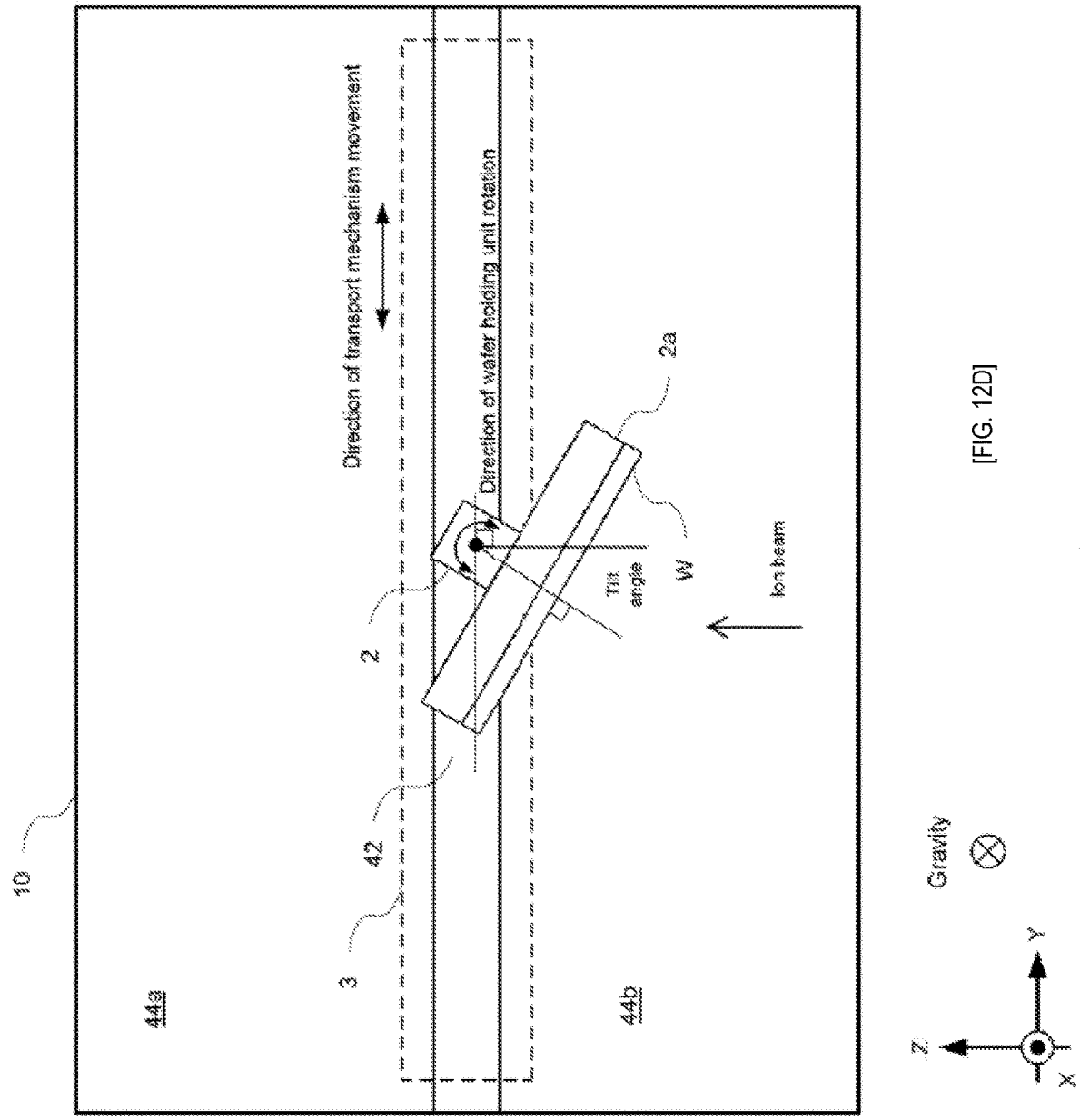
[FIG. 12D]

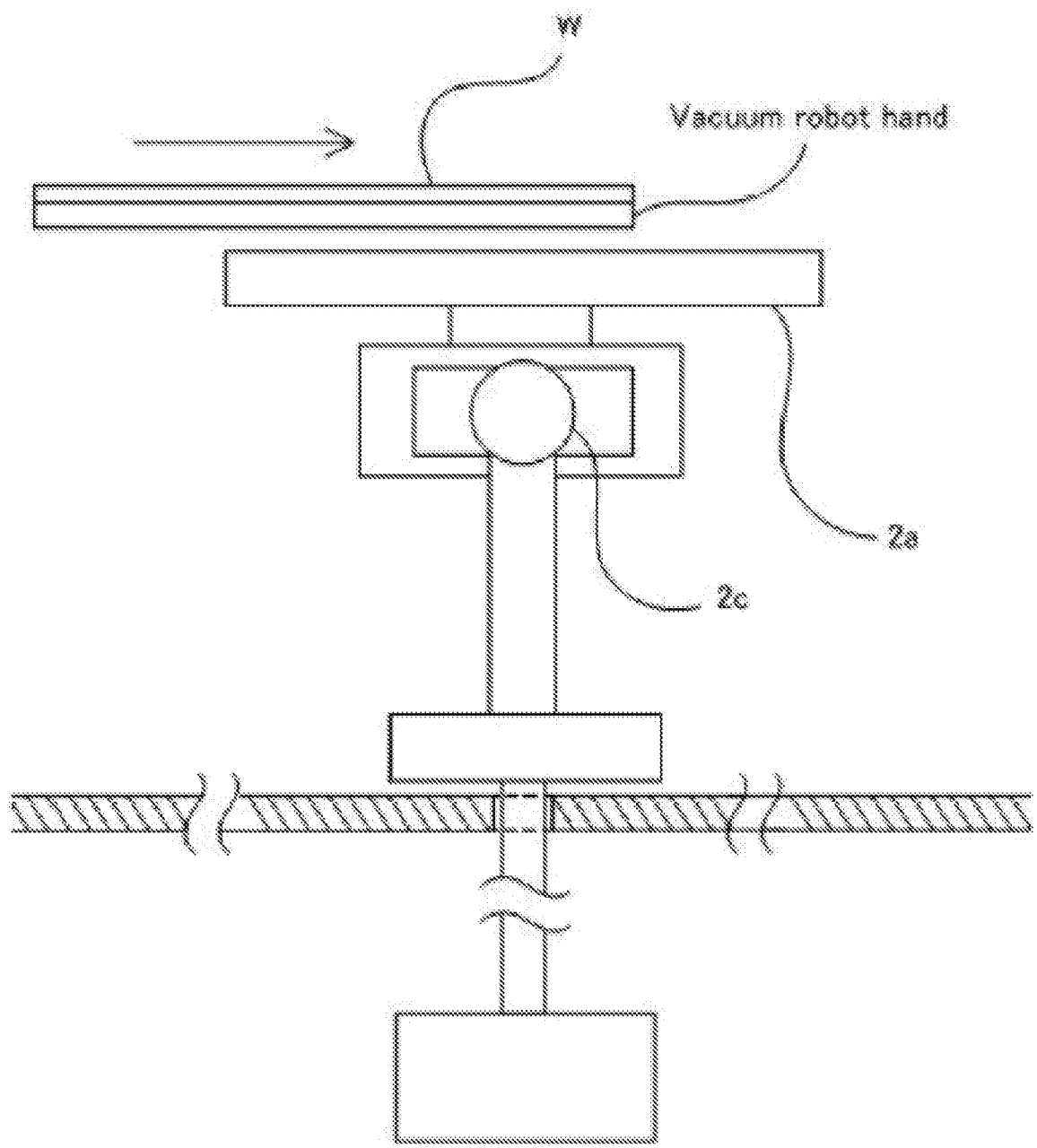
[FIG. 13A]

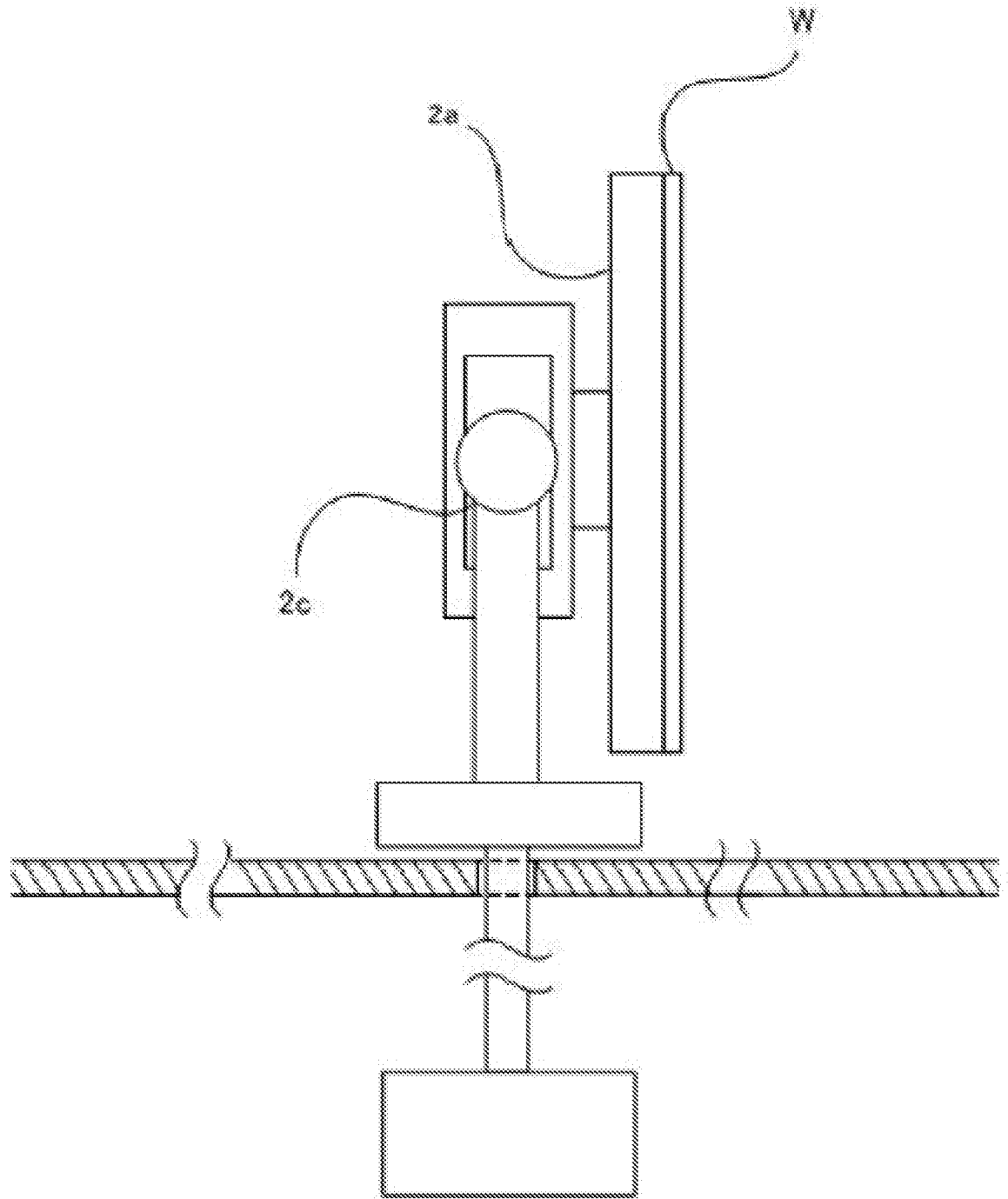
[FIG. 13B]

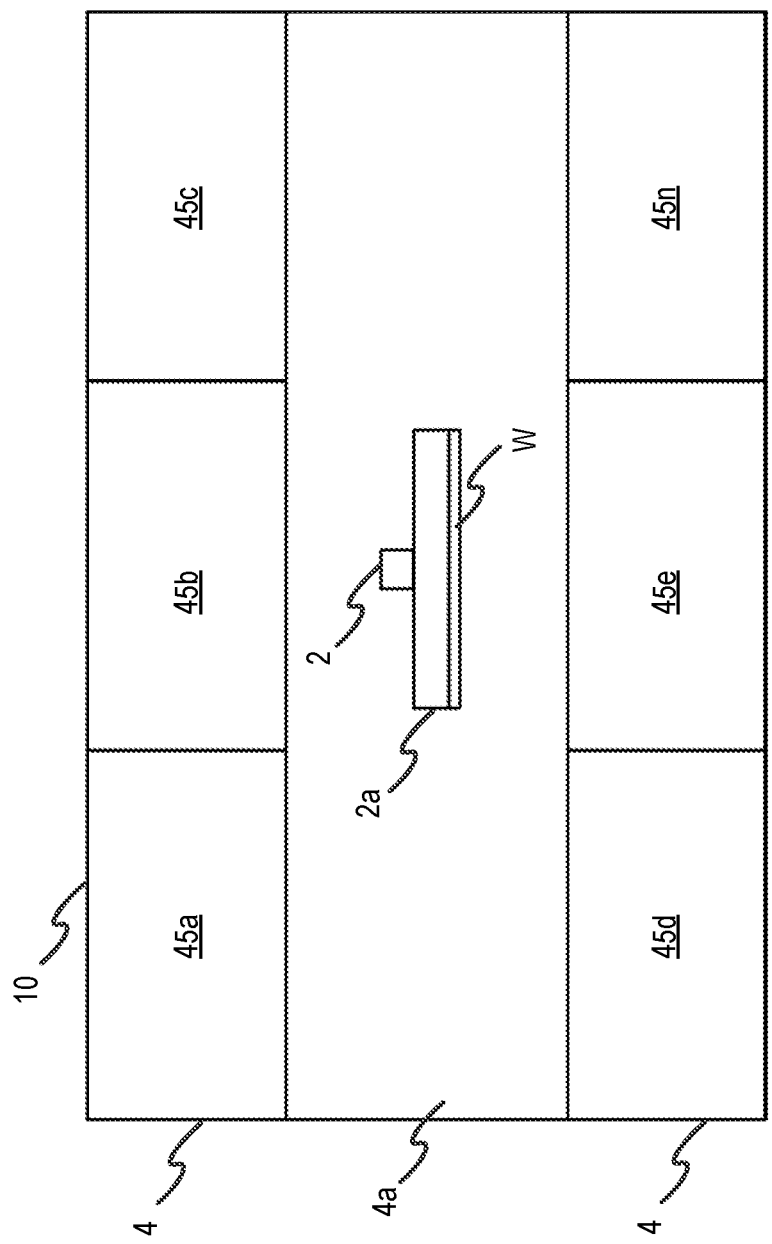
[FIG. 14A]

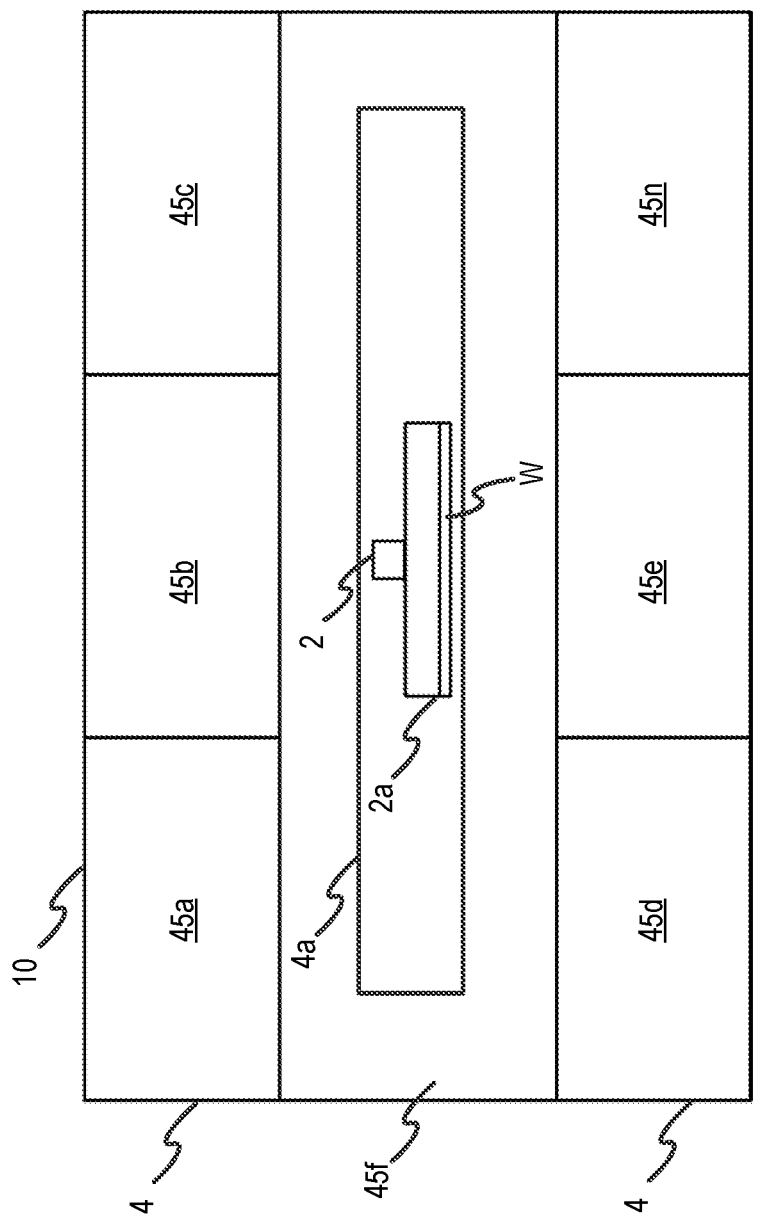
[FIG. 14B]

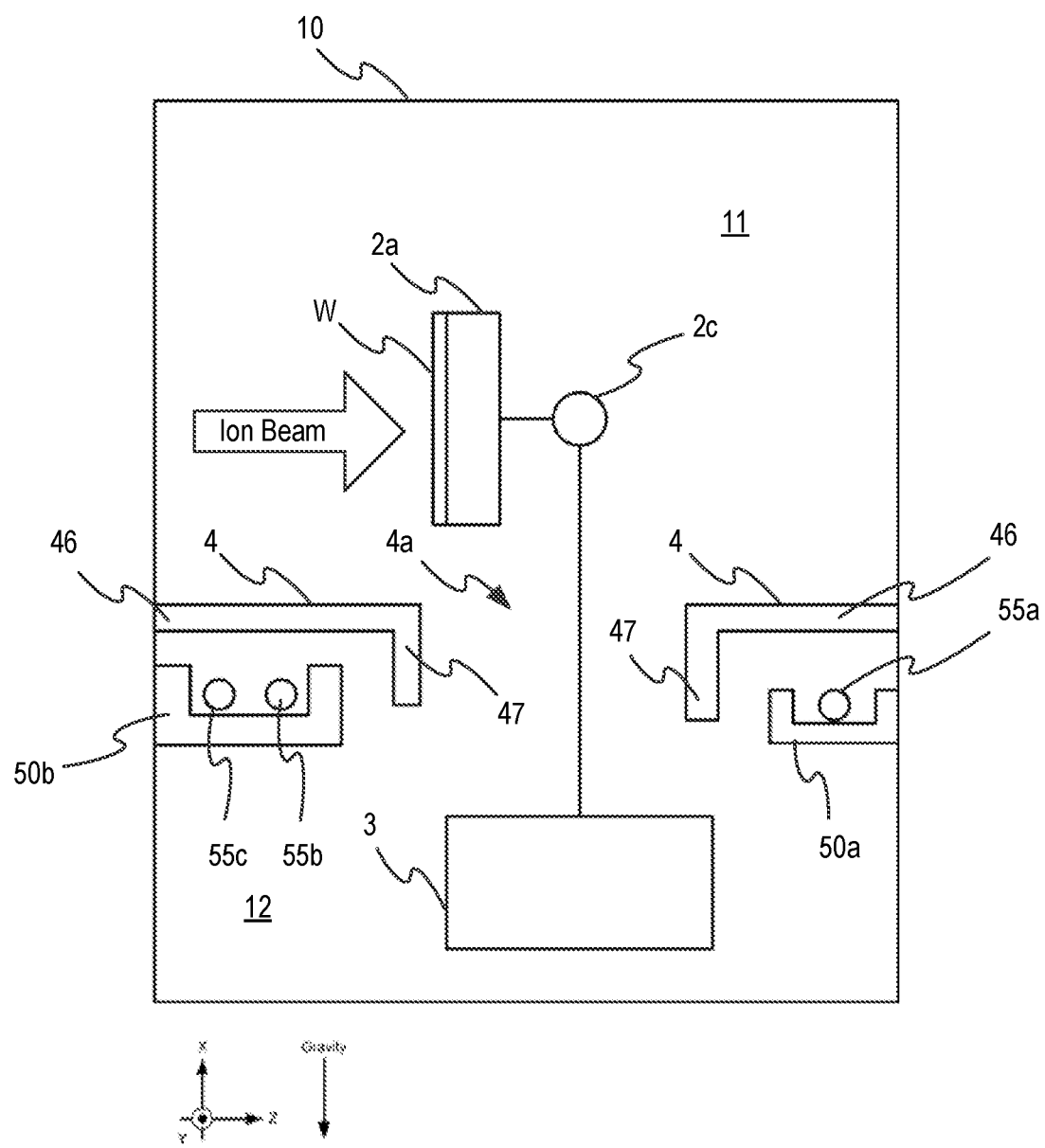
[FIG. 15]

ION BEAM IRRADIATION APPARATUS

CROSS-REFERENCE TO RELATED APPLICATION

This application is a continuation-in-part of U.S. patent application Ser. No. 15/585,562, filed on May 3, 2017, which is a continuation-in-part of U.S. patent application Ser. No. 14/067,477, filed on Oct. 30, 2013, which claims foreign priority under 35 USC 119 to Japanese Patent Application No. 2013-33214, filed on Feb. 22, 2013, the contents of which are incorporated herein by reference in their entireties.

BACKGROUND

1. Technical Field

Aspects of the example implementations relate to an ion beam irradiation apparatus that irradiates a wafer with an ion beam.

2. Related Art

As shown in Patent Citation 1, in a related art ion beam irradiation apparatus, a wafer holder, on which a wafer is placed, and a movement mechanism, which moves this wafer holder, are provided inside a wafer processing chamber (vacuum chamber). This movement mechanism uses a so-called linear motion mechanism, for example, a ball-screw mechanism.

However, a movement mechanism that employs a ball-screw mechanism and the like becomes a source that generates particles, i.e. foreign material. The generated particles are dispersed in the wafer processing chamber and adhere to the wafer. This creates the problem that the particles adhered to the wafer may cause ion implantation defects.

It should be noted that Patent Citation 2 describes a substrate processing apparatus in which, in a case that is equipped with a linear motion mechanism for moving a substrate-supporting moving member in a vertical direction and stores said linear motion mechanism, a portion of the moving member protrudes outside and a slit that extends in a vertical direction is formed in the case, and, in said slit, there is provided a seal belt or other sealing means.

However, in this substrate processing apparatus, there is a vent provided at the distal end of the case facing in the direction of movement of the moving member, as a result of which the case cannot be evacuated to a vacuum, contamination due to atmospheric air flowing into the substrate processing chamber, which is in communication with the case through the slit, cannot be prevented, and the apparatus cannot be employed as an ion beam irradiation apparatus. Yet another problem is that friction between the moving member and the sealing means generates particles, and the generated particles are dispersed and adhere to the substrate.

RELATED ART

Patent Literature

[Patent Citation 1]
Japanese Patent Application Publication No. 2011-187393.

[Patent Citation 2]
Japanese Patent Application Publication No. 2002-305230.

SUMMARY

Problems to be Addressed

Accordingly, an object of the example implementations is not only to prevent the generation of particles in the wafer processing chamber, but also to prevent the dispersion of particles in the wafer processing chamber and to prevent the adhesion of the particles to the wafer in the wafer processing chamber.

Means for Addressing the Problems

Namely, the inventive ion beam irradiation apparatus is an ion beam irradiation apparatus for irradiating a wafer with an ion beam, provided with a wafer processing chamber that houses a wafer supporting mechanism supporting the wafer and is used for irradiating the wafer supported by the wafer supporting mechanism with an ion beam, and a transport mechanism housing chamber that houses a transport mechanism provided underneath the wafer processing chamber and is used for moving the wafer supporting mechanism in a substantially horizontal direction, wherein an aperture used for moving the wafer supporting mechanism along with a coupling member coupling the wafer supporting mechanism to the transport mechanism is formed in the direction of movement of the transport mechanism in a partition wall separating the wafer processing chamber from the transport mechanism housing chamber.

In such an apparatus, the wafer processing chamber that houses the wafer supporting mechanism and the transport mechanism housing chamber that houses the transport mechanism, i.e. the particle-generating source, are separated by the partition wall, thereby allowing for particles generated by the transport mechanism to be prevented from penetrating and dispersing in the wafer processing chamber as well as preventing the particles from adhering to the wafer in the wafer processing chamber. In addition, since an aperture used for moving the coupling member is formed in the direction of movement of the transport mechanism in the partition wall separating the wafer processing chamber from the transport mechanism housing chamber, forming the aperture only in the region required for the movement of the coupling member makes it possible to further reduce the amount of the particles penetrating and dispersing in the wafer processing chamber and further prevent the particles from adhering to the wafer in the wafer processing chamber. Therefore, the ion implantation defects generated by the adhesion of the particles to the wafer can be reduced.

In addition, when a venting mechanism, which evacuates the wafer processing chamber and transport mechanism housing chamber to a vacuum, is provided such that gas is exhausted only from the wafer processing chamber, there is a risk that the particles generated in the transport mechanism housing chamber, driven by the venting flow produced by the venting mechanism, may penetrate and disperse in the wafer processing chamber and may adhere to the wafer.

In order to eliminate these problems, the venting mechanism, which evacuates the wafer processing chamber and transport mechanism housing chamber to a vacuum, is optionally provided such that gas is exhausted at least from the transport mechanism housing chamber side.

In such a case, particles generated in the transport mechanism housing chamber can be expelled from the transport mechanism housing chamber without causing them to move from the transport mechanism housing chamber to the wafer processing chamber, the particles can be prevented from penetrating and dispersing in the wafer processing chamber, and the adhesion of the particles to the wafer in the wafer processing chamber can also be prevented.

The partition wall may be formed by a portion of the bottom wall that forms the wafer processing chamber and a housing that forms the transport mechanism housing chamber is provided on the underside of the above-mentioned bottom wall portion in a detachable manner.

In such a case, forming the housing on the bottom wall portion in a detachable manner makes it possible to work on the transport mechanism by removing it along with the housing and thereby facilitate maintenance operations when maintenance is performed on the transport mechanism.

The housing, which is provided on the underside of the bottom wall portion in a detachable manner, may have a side wall portion surrounding the transport mechanism housing chamber and a cover provided such that an aperture portion formed at the bottom of said side wall portion can be opened and closed.

In such a case, due to the fact that the cover is formed such that the aperture portion of the side wall portion can be opened and closed, providing the transport mechanism on the bottom wall portion or side wall portion makes it possible to work simply by opening the cover without removing the transport mechanism and can facilitate maintenance operations when performing maintenance on the inside of the transport mechanism housing chamber.

Optionally, the transport mechanism has a drive unit and a movement guide mechanism driven by the drive unit that moves the wafer supporting mechanism and coupling member, the movement guide mechanism is disposed inside the transport mechanism housing chamber, and the drive unit is placed under atmospheric pressure conditions.

In such a case, placing the drive unit under atmospheric pressure conditions and not inside the transport mechanism housing chamber and wafer processing chamber evacuated to a vacuum permits use of a generic motor that can be used under atmospheric pressure conditions, which can reduce manufacturing costs. In addition, since the drive unit, which can become a particle-generating source, is not placed in the transport mechanism housing chamber, the amount of particles generated in the transport mechanism housing chamber can be reduced, thereby reducing the amount of particles penetrating and dispersing in the wafer processing chamber and making it possible to prevent the adhesion of the particles to the wafer in the wafer processing chamber.

An adhesion prevention unit may be provided between the transport mechanism and the wafer supported by the wafer supporting mechanism for preventing the adhesion of the particles generated by the transport mechanism to the wafer supported by the wafer supporting mechanism.

In such a case, providing the adhesion prevention unit between the wafer and the transport mechanism makes it possible to prevent the adhesion of particles generated by the transport mechanism to the wafer supported by the wafer supporting mechanism.

In addition, the adhesion prevention unit may be a shield plate provided in the longitudinal direction of the aperture (in the direction of movement of the transport mechanism) closer to the wafer supporting mechanism than to the aperture formed in the partition wall.

In such a case, even if particles do penetrate the wafer processing chamber, the adhesion of the particles to the wafer in the wafer processing chamber can be impeded. In addition, using a shield plate provided in the longitudinal direction of the aperture as an adhesion prevention unit makes it possible to simplify the configuration of the adhesion prevention unit.

The end of the adhesion prevention unit facing the ion beam-incident side optionally protrudes farther towards the ion beam-incident side than the wafer supported by the wafer supporting mechanism.

In such a case, the fact that the end of the adhesion prevention unit facing the ion beam-incident side protrudes farther towards the ion beam-incident side than the wafer supported by the wafer supporting mechanism makes it possible to further prevent the adhesion of the particles to the wafer in the wafer processing chamber.

The length dimensions of the adhesion prevention unit in the direction of movement may exceed the length dimensions of the wafer supported by the wafer supporting mechanism in the direction of movement.

In such a case, the adhesion prevention unit can effectively reduce the amount of particles penetrating within the vicinity of the wafer in the wafer processing chamber and efficiently prevent the penetration of particles into the wafer processing chamber through the aperture, and can also prevent the adhesion of the particles to the wafer in the wafer processing chamber.

The aperture optionally has a cover member that covers at least a portion thereof on one or both sides in the direction of movement of the coupling member.

In such a case, the fact that the cover member covers the aperture can prevent the penetration of the particles into the wafer processing chamber through the aperture and can prevent the adhesion of the particles to the wafer in the wafer processing chamber.

In some embodiments, the partition wall may be a hindrance to entering the lower and/or upper chamber or working in either chamber. Thus, the partition wall may be provided independently and detachable independent of the lower and upper chambers to be facilitate maintenance. In some embodiments, the partition wall may be divided into a plurality of plate members in order to facilitate attachment and detachment.

The ion beam apparatus may also include various components placed under the partition wall. Example components include, but are not limited to electric wires that supply power and signals to each mechanism, tubes for cooling water or cooling gas, and sensors. The partition wall may be arranged to protect these components from the ion beam and/or particles generated by the transport mechanism. If the partition wall is absent, the ion beam reflected in the chamber by the wafer and/or particles generated by the transport mechanism may impact and damage the components.

Effects

In accordance with the thus configured example implementation, not only is the generation of particles prevented in the wafer processing chamber, but it is also possible to prevent the dispersion of particles in the wafer processing chamber and prevent the adhesion of the particles to the wafer in the wafer processing chamber.

BRIEF DESCRIPTION OF THE DRAWINGS

FIG. 1
A diagram illustrating the overall configuration of the ion beam irradiation apparatus of this example embodiment.

FIG. 2
An oblique view schematically illustrating the configuration of the ion beam irradiation unit of the same example embodiment.

FIG. 3
A front view illustrating the configuration of the ion beam irradiation unit of the same example embodiment.

FIG. 4
A plan view illustrating the configuration of the partition wall and transport mechanism of the same example embodiment.

FIG. 5A
A side view illustrating the configuration of the ion beam irradiation unit of the same example embodiment as viewed in the direction of movement.

FIG. 5B
A side view illustrating the configuration of the ion beam irradiation unit in a variant example embodiment as viewed in the direction of movement illustrating a loading angle adjustment.

FIG. 6
A side view illustrating the configuration of the partition wall and transport mechanism in a variant example embodiment as viewed in the direction of movement.

FIG. 7
A side view illustrating the configuration of the partition wall and transport mechanism in a variant example embodiment as viewed in the direction of movement.

FIG. 8
A side view illustrating the configuration of the ion beam irradiation unit in a variant example embodiment as viewed in the direction of movement.

FIG. 9
A front view illustrating the configuration of the ion beam irradiation unit in a variant example embodiment.

FIG. 10
A plan view illustrating the configuration of the partition wall and transport mechanism in a variant example embodiment.

FIG. 11
A side view illustrating the configuration of the partition wall and transport mechanism in a variant example embodiment as viewed in the direction of movement.

FIGS. 12A-12D
Views illustrating movement directions of the transport mechanism and the wafer holding unit for a configuration of the ion beam irradiation unit in a variant example embodiment.

FIGS. 13A-13B
Views illustrating rotation of the wafer holding unit by the loading angle adjustment mechanism for loading and unloading a wafer.

FIGS. 14A-14B
Plane views illustrating configurations of the partition wall and wafer supporting mechanism in variant example embodiments.

FIG. 15
A side view illustrating a configuration of the partition wall and compartments in a variant example embodiment as viewed in the direction of movement.

DETAILED DESCRIPTION OF EXAMPLE IMPLEMENTATIONS

An example embodiment of the present invention is described below with reference to drawings.

This ion beam irradiation apparatus 100 is an ion beam irradiation apparatus 100 used for irradiating the surface of a wafer W with an ion beam IB to implant ions into the wafer W and impart desirable characteristics to the wafer W.

It should be noted that the wafer W is, for example, a silicon substrate or another semiconductor substrate, a glass substrate, or another substrate. Although its planar shape in this example embodiment is roughly circular, in addition, it may be rectangular or of some other different shape.

FIG. 1 is a schematic plan view illustrating an ion beam irradiation apparatus 100 according to a first example embodiment. In this ion beam irradiation apparatus 100, an ion beam IB extracted from an ion source 101 is mass-analyzed in a mass analyzer 102 and then used to irradiate a wafer W secured to a wafer supporting mechanism 2 in an ion beam irradiation unit 200 in order to implant the desired ion species into the wafer W. It should be noted that the path of the ion beam IB from the ion source 101 to the wafer supporting mechanism 2 is enclosed in a vacuum vessel (not shown) and maintained under vacuum during ion implantation.

The ion beam IB extracted from the ion source 101 is a sheet-like, so-called ribbon-shaped ion beam IB. Namely, if the direction of its travel immediately prior to entering the wafer W is designated as the Z-axis direction, its width in the X-axis direction, i.e. in a direction from the front to the back surface of the paper sheet in FIG. 1, is considerably larger than its thickness in the Y-axis direction, i.e. the direction normal thereto.

At such time, as shown in FIG. 2 and FIG. 3, the wafer W is caused to reciprocate in the Y-direction by a transport mechanism 3. The reciprocating motion of the wafer W and irradiation by the ribbon-shaped ion beam IB allow for ion implantation to be performed across the entire surface of the wafer W.

The configuration of the ion beam irradiation unit 200 used in the ion beam irradiation apparatus 100 of the present example embodiment will be described below with reference to FIG. 2-FIG. 5A.

In particular, as shown in FIG. 3, the ion beam irradiation unit 200 has a wafer processing chamber 20, which houses a wafer supporting mechanism 2 used to support a wafer W, and a transport mechanism housing chamber 30, which is provided underneath the wafer processing chamber 20 in the X direction (directly underneath) and houses the transport mechanism 3 used to move the wafer supporting mechanism 2.

As shown in FIG. 2-FIG. 5A, the wafer supporting mechanism 2, which is housed in the wafer processing chamber 20, has a wafer holding unit 2a, which holds a wafer W with the help of an electrostatic chuck. The wafer supporting mechanism 2 may include a loading angle adjustment mechanism 2c used to adjust the angle of said wafer holding unit 2a. This loading angle adjustment mechanism 2c has a loading angle adjustment capability, whereby it rotates the wafer holding unit 2a about a central axis parallel to the Y-direction (i.e., around a central axis parallel to a direction of movement of the transport mechanism). One of ordinary skill in the art will appreciate that the central axis of the loading angle adjustment mechanism 2c is parallel to a direction of movement of the transport mechanism 3 when a tilt angle of the wafer holding unit 2a is zero, and is not parallel when the tilt angle of the wafer holding unit 2a is non-zero.

The loading angle adjustment mechanism 2c may also position the wafer holding unit 2a to enable transfer of a wafer to a vacuum robot after ion implantation and receive a new wafer from a vacuum robot by changing a position of a wafer holding unit 2a. Referring to FIG. 13A, the loading angle adjustment mechanism 2c may rotate the wafer holding unit 2a to a position approximately parallel to a hand of a vacuum robot to enable unloading of a wafer that has undergone ion implantation and to receive a new wafer to be processed. As shown in FIG. 13B, after receiving the new wafer, the loading angle adjustment mechanism 2c may rotate the wafer holding unit 2a to a position for processing the new wafer. One of ordinary skill in the art will appreciate that the illustrated positions for loading/unloading and processing are merely exemplary and other positions may be used without departing from the scope of the disclosure.

The wafer supporting mechanism 2 may also include a twist angle adjustment capability, whereby it rotates the wafer holding unit 2a about a central axis parallel to the Z-direction (i.e., around a central axis normal to a face of the wafer), as illustrated in FIG. 5A.

The transport mechanism 3 housed in the transport mechanism housing chamber 30 is disposed underneath the wafer supporting mechanism 2 in the X-direction and moves the wafer supporting mechanism 2 in a direction across the irradiation region p (see FIG. 2) of the ion beam IB, in other words, in the Y-direction, i.e. in a substantially horizontal direction. In the present example embodiment, the irradiation region P, which is the location where the wafer W undergoes ion implantation, has an elongated shape identical to the cross-sectional shape of the ion beam IB, i.e. a shape whose dimensions in the X-direction are larger than its dimensions in the Y-direction. In this irradiation region P, the transport mechanism 3 moves the wafer supporting mechanism 2 transverse to a lateral direction (direction comprising the Y-direction component) generally perpendicular to the longitudinal direction (X-direction) of said irradiation region P.

Specifically, as shown in FIG. 3 and FIG. 4, the transport mechanism 3 is a linear motion mechanism having a drive unit 31, which is drive motor such as a scan motor and the like, and a movement guide mechanism 32, which is driven by said drive unit 31 to move the wafer supporting mechanism 2 and the hereinafter described coupling member 5. The movement guide mechanism 32 of the present embodiment employs a ball-screw mechanism and is equipped with ball screw 32a provided in a generally horizontal direction (Y-direction), a moving member 32b having a nut (not shown) threadedly engaged with said ball screw 32a and moving in a generally horizontal direction, and a base member 32c rotatably holding the ball screw 32a. In addition, the moving member 32b is coupled with the wafer supporting mechanism 2 by a coupling member 5 protruding in a vertical direction (X-direction). It should be noted that a cover (not shown) is provided around the periphery of the moving member 32b to prevent particles from scattering.

It should be noted that a drive transmission means 33 used for transmitting the drive of the drive unit 31 is provided between the ball screw 32a and the drive unit 31. Along with transmitting the drive of the drive unit 31 to the ball screw 32a, the drive transmission means 33 of the present example embodiment, which employs e.g. a ferrofluidic seal, acts as a vacuum seal and allows for the transport mechanism housing chamber 30 to be evacuated to a vacuum, as will be described below.

Next, the wafer processing chamber 20 and transport mechanism housing chamber 30 will be described in detail.

As shown in FIG. 2 and FIG. 3, the wafer processing chamber 20 is a box 21 formed as a substantially rectangular parallelepiped. This box 21 has a side wall portion 210 surrounding the periphery of the wafer processing chamber 20 in the YZ plane, a top wall portion 220 covering the top side of the wafer processing chamber 20, and a bottom wall portion 230 covering the bottom side of the wafer processing chamber 20. In addition, an inlet opening 21a used for guiding said ion beam IB into the wafer processing chamber 20 is formed in the side of the side wall portion 210, on which the ion beam IB is incident. Furthermore, a venting mechanism 20A, which employs a turbo-molecular pump or another vacuum pump for evacuating said wafer processing chamber 20 to a vacuum, is provided in the wafer processing chamber 20, e.g. on the side wall portion 210 thereof (see FIG. 3). The wafer processing chamber 20 is evacuated to a vacuum mainly with the help of this venting mechanism 20A.

As shown in FIG. 3, the transport mechanism housing chamber 30 is formed by mounting a housing 300 to the underside of the bottom wall portion 230. In other words, the transport mechanism housing chamber 30 is formed by the bottom wall portion 230 and the housing 300. This housing 300 is provided such that it encloses the hereinafter described aperture 4a in the underside of the bottom wall portion 230 and is made up of a side wall portion 310, which surrounds the periphery of the transport mechanism housing chamber 30, and a cover 320, which is provided such that the aperture portion 311 formed at the bottom of said side wall portion 310 can be opened and closed. In addition, the movement guide mechanism 32 is secured to the side wall portion 310 of the housing 300. Specifically, a base member 32c is secured to the side wall portion 310. Furthermore, a venting mechanism 30A, which employs a turbo-molecular pump or another vacuum pump for evacuating said transport mechanism housing chamber 30 to a vacuum, is provided in the transport mechanism housing chamber 30, e.g. on the side wall portion 310 thereof (see FIG. 3). The transport mechanism housing chamber 30 is evacuated to a vacuum mainly with the help of this venting mechanism 30A.

The side wall portion 310 is provided on the bottom wall portion 230 in a detachable manner; specifically, it is secured to the underside of the bottom wall portion 230 using fastening members T1. In addition, the cover 320 is provided such that the aperture portion 311 formed at the bottom of the side wall portion 310 can be opened and closed. Specifically, it is secured to a flange section formed in the aperture portion 311 using fastening members T2.

Thus, as shown in FIG. 2 and FIG. 3, in the ion beam irradiation apparatus 100 of the present embodiment, the wafer processing chamber 20 is separated from the transport mechanism housing chamber 30 by the bottom wall portion 230. In other words, the bottom wall portion 230 serves as a partition wall 4 that separates the wafer processing chamber 20 from the transport mechanism housing chamber 30. The partition wall 4 is formed substantially parallel to the YZ plane, in other words, in a substantially horizontal manner. In addition, this partition wall 4 has an aperture 4a formed therein for moving the wafer supporting mechanism 2 along with a coupling member 5 coupling the wafer supporting mechanism 2 and the transport mechanism 3.

In particular, as shown in FIG. 5A, the coupling member 5 couples the base 2b of the wafer supporting mechanism 2 and the moving member 32b. Namely, as the moving member 32b of the transport mechanism 3 moves, the coupling member 5 moves integrally with the wafer supporting mechanism 2. It should be noted that the coupling member 5 and moving member 32b may be formed integrally as a single member. In addition, the base 2b is provided with a tilt angle adjustment mechanism for rotating the wafer holding unit 2a about a central axis parallel to the X-direction (i.e., around a central axis vertically perpendicular to a direction of movement of the transport mechanism) for adjustment of the tilt angle of the wafer holding unit 2a. The tilt angle adjustment mechanism enables scanning of the wafer at an angle other than zero degrees with respect to the movement direction of the transport mechanism 3 (see for example FIG. 12D).

As shown in FIG. 3-FIG. 5A, the aperture 4a, which enables free movement of the coupling member 5 by the transport mechanism 3, extends substantially horizontally in the direction of movement of the coupling member 5 by the transport mechanism 3. Specifically, this aperture 4a is a slit-shaped elongated opening whose shape in plan view extends in the direction of movement. In the present embodiment, the shape of the aperture 4a is substantially rectangular. The size of the aperture 4a is larger than at least the moving region MR of the coupling member 5 and it should be large enough to not impede the movement of the coupling member 5. Specifically, the dimension L1 of the aperture 4a in the longitudinal direction (see FIG. 3) is larger than the dimension of the moving region MR of the coupling member 5 in the longitudinal direction, and its dimension L2 in the lateral direction (see FIG. 4) is larger than the dimension of the coupling member 5 in the width direction.

Effects

In accordance with the thus constructed ion beam irradiation apparatus 100 of the present embodiment, using the partition wall 4 to separate the wafer processing chamber 20 that houses the wafer supporting mechanism 2 and the transport mechanism housing chamber 30 that houses the transport mechanism 3, i.e. the main particle-generating source, makes it possible to prevent particles generated by the transport mechanism 3 from penetrating and dispersing in the wafer processing chamber 20 as well as prevents the particles from adhering to the wafer W in the wafer processing chamber 20.

In addition, the fact that the aperture 4a formed in the partition wall 4 is formed in the direction of movement of the coupling member 5 by the transport mechanism 3 and said aperture 4a is formed only in the region required for the movement of the coupling member 5 allows for the amount of the particles penetrating and dispersing in the wafer processing chamber 20 to be further reduced as well as further prevents the particles from adhering to the wafer W in the wafer processing chamber 20.

Furthermore, providing a dedicated venting mechanism 30A used for evacuating the transport mechanism housing chamber 30 to a vacuum in said transport mechanism housing chamber 30 makes it possible to expel the particles generated by the transport mechanism housing chamber 30 outside without allowing them to penetrate the wafer processing chamber 20 and can prevent the particles from adhering to the wafer W in the wafer processing chamber 20.

In addition, the fact that the cover 320 can be opened and closed and the transport mechanism 3 is provided on the side wall portion 310 allows for work to be done by removing the cover 320 without removing the transport mechanism 3 and can facilitate maintenance operations when maintenance is performed on the inside of the transport mechanism housing chamber 30.

Additionally, the fact that the drive unit 31 is adapted to be placed under atmospheric pressure conditions makes it possible to use a generic motor and reduce manufacturing costs. In addition, since the drive unit 31, which can become a particle-generating source, is not placed inside the transport mechanism housing chamber 30, the amount of particles generated in the transport mechanism housing chamber 30 can be reduced, thereby reducing the amount of particles penetrating the wafer processing chamber 20 and making it possible to prevent the dispersion and adhesion of the particles to the wafer in the wafer processing chamber 20.

Other Variant Embodiments

It should be noted that the present inventive concept is not limited to the above-described example embodiment. For example, as illustrated in FIG. 5B, the wafer supporting mechanism 2 has a wafer holding unit 2a which holds a wafer W with the help of an electrostatic chuck, and a base 2b is provided with a tilt angle adjustment mechanism used to adjust the tilt angle of the wafer holding unit 2a. A loading angle adjustment mechanism 2c has a loading angle adjustment capability, whereby it rotates the wafer holding unit 2a about a central axis parallel to the Y-direction (i.e., around a central axis parallel to a direction of movement of the transport mechanism). One of ordinary skill in the art will appreciate that the central axis of the loading angle adjustment mechanism 2c is parallel to a direction of movement of the transport mechanism 3 when a tilt angle of the wafer holding unit 2a is zero, and is not parallel when the tilt angle of the wafer holding unit 2a is non-zero. The wafer supporting mechanism 2 may also include a twist angle adjustment capability, whereby it rotates the wafer holding unit 2a about a central axis parallel to the Z-direction (i.e., around a central axis normal to a face of the wafer).

In addition, the wafer processing chamber and the transport mechanism housing chamber are combined into one chamber 10. Referring to FIGS. 12A-12D, the chamber 10 is separated with a first partition wall 44a and a second partition wall 44b such that wafer processing takes place in the upper portion 11 of the chamber 10 while the transport mechanism 3 is disposed in the lower portion 12 of the chamber 10. The first and second partition walls 44a, 44b may be separated by aperture 42 formed in the direction of movement of the coupling member 5 by the transport mechanism 3. In some example embodiments, an aperture may be formed in a single partition wall only in the region of movement of the coupling member 5 to reduce the amount of the particles penetrating and dispersing in the upper portion 11 as well as to minimize the particles from adhering to the wafer W in the upper portion 11. As illustrated in FIGS. 5B, 12A, and 12B, gravity assists the partition wall or walls in minimizing the migration of particles produced by the transport mechanism 3 from the lower portion 12 of the chamber 10 into the upper portion 11 of the chamber 10 thereby preventing contamination of a wafer being processed.

A venting mechanism that evacuates the chamber 10 to a vacuum may be provided in the lower portion 12 of the chamber 10 and optionally also in the upper portion 11 of the chamber 10.

FIGS. 12A-12D illustrate movement directions of the transport mechanism 3 and the wafer holding unit 2. As illustrated in FIGS. 12A and 12B, the transport mechanism 3 moves the wafer supporting mechanism 2 in the Y direction along the aperture 42. The aperture 42 separates the first partition wall 44a from the second partition wall 44b. In some example embodiments, an aperture may be formed in a single partition wall only in the region of movement of the coupling member 5 of the transport mechanism 3. FIG. 12A also illustrates the loading angle adjustment direction of the wafer holding unit 2a around a central axis parallel to the Y axis and FIG. 12B illustrates the twist angle adjustment of the wafer holding unit 2a around a central axis parallel to the Z-direction.

FIGS. 12C and 12D illustrate the direction of wafer holding unit 2a tilt with respect to the direction of movement of the transport mechanism 3. FIG. 12C illustrates the wafer holding unit 2a in a position with the face of the wafer W parallel to a central axis that is parallel to the Y-direction, i.e., the direction of movement of the transport mechanism 3. FIG. 12D shows the wafer holding unit 2a rotated about an axis parallel to a central axis that is parallel to the X-direction for adjustment of the tilt angle of the wafer holding unit 2a.

In a further example embodiment, as shown in FIG. 6 and FIG. 7, the ion beam irradiation apparatus 100 may be provided with an adhesion prevention unit 6 between the transport mechanism 3 and the wafer W supported by the wafer supporting mechanism 2 for preventing the particles generated by the transport mechanism 3 from adhering to the wafer W. In such a case, providing the adhesion prevention unit 6 impedes the adhesion of the particles generated by the transport mechanism 3 to the wafer W.

The adhesion prevention unit 6 illustrated in FIG. 6 is formed as a protrusion from the base 2b of the wafer supporting mechanism 2 and is provided between the transport mechanism 3 and the wafer W supported by the wafer supporting mechanism 2. Specifically, this adhesion prevention unit 6 is a shield plate provided in the longitudinal direction (e.g., the direction of movement of the transport mechanism 3) of the aperture 4a. In addition, the distal end 6a of the shield plate serving as the adhesion prevention unit 6 protrudes farther towards the side on which the ion beam IB is incident than the wafer W. Furthermore, the length dimensions in a direction facing in the direction of movement are adapted to be at least larger than the length dimensions in the direction facing in the direction of movement of the wafer W. In such a case, even if particles do penetrate the wafer processing chamber 20, the adhesion of the particles to the wafer W in the wafer processing chamber 20 can be impeded. In addition, the fact that the adhesion prevention unit 6 is constituted by a shield plate provided in the longitudinal direction of the aperture 4a allows for the configuration of the adhesion prevention unit 6 to be simplified. In addition, as shown in FIG. 7, in addition to the construction of the adhesion prevention unit 6 of FIG. 6, the unit may be formed on the upper surface of the partition wall 4. If the adhesion prevention unit 6 is formed in this manner on the upper surface of the partition wall 4, it is optional to form the unit at the edge of the aperture defining the aperture 4a or in the vicinity thereof.

Furthermore, in another aspect of the adhesion prevention unit 6, as shown in FIG. 8, the unit may be provided inside the transport mechanism housing chamber 30. In this case, it is contemplated that the adhesion prevention unit 6 is formed on the coupling member 5. In addition, in another aspect of the adhesion prevention unit 6, the base 2b provided above the aperture 4a in the wafer supporting mechanism 2 may serve as the adhesion prevention unit 6.

In addition, as shown in FIG. 9 and FIG. 10, in the aperture 4a, there may be provided a shutter or another cover member 7 covering at least a portion thereof on one or both sides in the direction of movement of the coupling member 5. This cover member 7 may be movable following movement of the coupling member 5, e.g. it may move integrally with the coupling member 5 or it may be moved by a dedicated drive motor. In such a case, the cover member 7 can prevent particles from penetrating the wafer processing chamber 20 through the aperture 4a and can prevent particles from dispersing in the wafer processing chamber 20 and adhering to the wafer.

The transport mechanism 3 is not limited to a ball screw mechanism and may be a different mechanical linear motion mechanism, e.g. a mechanism with a timing belt or rack and pinion, or a mechanism with an air bearing and differential pumping. In addition, the transport mechanism 3 may be an electromagnetic linear motion mechanism, e.g. a mechanism utilizing a linear motor.

As shown in FIG. 11, the housing 300 may have a top wall portion 330. If the housing 300 has a top wall portion 330, said top wall portion 330 may serve as the partition wall 4. In other words, the aperture 4a is formed in the top wall portion 330.

In addition, the partition wall 4 may be provided independently from the box 21 and housing 300, or it may be provided such that it can be attached to and detached from the box 21 and housing 300.

In the housing 300 that forms the transport mechanism housing chamber 30, the side wall portion 310 may be formed integrally with the cover 320. In such a case, providing the housing on the underside of the bottom wall portion 230 in a detachable manner makes it possible to work by removing the transport mechanism 3 along with the housing 300 and can facilitate maintenance operations when maintenance is performed on the transport mechanism 3. In addition, the cover 320 may be mounted to the side wall portion 310 through the medium of hinge or other connecting members.

The drive transmission means 33 does not necessarily have to use a ferrofluidic seal as long as it can maintain the airtightness of the transport mechanism housing chamber 30. For example, a bearing with a sealing member such as an O-ring may be employed. In such a case, the material of the side wall portion 310 does not have to be non-magnetic and the side wall portion 310 may be formed from any general-purpose structural material. In addition, it may utilize a magnetic coupling, etc. for transmitting drive across the side wall 310.

The transport mechanism housing chamber 30 does not necessarily have to be formed by the bottom wall portion 230 and the housing 300. For example, the transport mechanism housing chamber 30 may be formed inside the box 21 defining the wafer processing chamber 20. In addition, as shown in FIG. 12, the transport mechanism housing chamber 30 may be formed by the cover 320 and a recessed portion formed in the bottom wall portion 230 of the box 21. In such a case, the ion beam irradiation unit 200 can be miniaturized and the ion beam irradiation apparatus 100 can be made more compact and its footprint can be reduced.

In some embodiments, the partition wall 4 (or first partition wall 44a and/or second partition wall 44b of FIGS. 12A-12D) may be a hindrance to entering the chamber 10 or working in the chamber 10. Therefore, the partition wall 4a may be provided independently from lower chamber 12

(e.g., the transport mechanism housing chamber 30) and the upper chamber 11 (e.g., wafer processing chamber 20) so to be removable during maintenance. Thus, partition wall 4 may be provided independently so as to attachable and detachable from both box 21 and housing 300 as described here. Accordingly, box 21 may be removed from the ion beam apparatus 100 without removing the partition wall 4 from housing 300, and housing 300 may be removed from the ion beam apparatus 100 without removing the partition wall 4 from the box 21.

In such a case, providing the partition wall 4 independent of both the upper chamber 11 and lower chamber 12 makes it possible to work on the parts housed in the upper chamber 11 or lower chamber 12 without leaving the other chamber open to contaminants. Thus, it is possible to work on the transport mechanism in the lower chamber 12 by removing it along with housing 300, without also removing the partition wall 4 from the box 21 and upper chamber 20. Similarly, it is possible to work on the wafer supporting mechanism in the upper chamber 11 by removing it along with box 21, without also removing the partition wall 4 from the housing 300 and lower chamber 12. Thus, facilitate maintenance operations when maintenance is performed on the respective parts.

Furthermore, the partition wall 4 may be divided into a plurality of plate members in order to facilitate attachment and detachment and ease of access, without a necessitating removal of the complete partition wall. Thus, for example, while lower chamber 12 is removed for maintenance, one or more plate members of the partition wall 4, which remains attached to the upper chamber protecting the upper chamber 11, may also be removed to facilitate maintenance of parts in the upper chamber 11 without exposing the entirety of the upper chamber 11 to the environment and contaminant therein or may facilitate access to the upper chamber 11 for other purposes (e.g., removal or insertion of wafer on to the wafer supporting mechanism).

For example, FIGS. 14A-14B illustrate plane views of configurations of the partition wall 4 and wafer supporting mechanism 2 in variant example embodiments of the ion beam irradiation apparatus 100. As described herein, the wafer processing chamber 20 and the transport mechanism housing chamber 30 are combined into chamber 10. Referring to FIGS. 14A and 14B, the chamber 10 is separated by a partition wall 4 having an aperture 4a formed therein for moving the wafer supporting mechanism 2 along the direction of movement as described in connection to the various embodiments provided herein.

In the illustrated embodiments of FIGS. 14A and 14B, the partition wall 4 comprises a plurality of plate members 45a through 45n (collectively referred to herein as "plate members 45") such that wafer processing takes place in an upper portion 11 of the chamber 10 while the transport mechanism 3 is disposed in the lower portion 12 of the chamber 10. The plurality of plate members may be arranged in a planar array of plate members, where the plane is along the moving direction.

As shown in FIG. 14A, aperture 4a may formed in the direction of movement of the coupling member 5 by the transport mechanism 3 such that a subset of plate members is separated from another subset of plate members. For example, plate members 45a-45c are separated by plate members 45d-45n. In another example, a first subset of plate members may be separated by a second subset of plate members by a third subset of plate members, the third subset of plate members having the aperture 4a formed therein. For example, as illustrated in FIG. 14B, plate members 45a-45c are separated from plate members 45d-45n by plate member 45f, which has aperture 4a formed therein.

While specific examples are provided herein, it will be understood that any number of plate members may be used to comprise the various subset of plate members. That is, while FIGS. 14A and 14B illustrate subsets of plate members including three plate members, any number of plate members may be utilized. For example, four, five, six, etc. number of plate members may be separated from the same or differing number of plate members. Furthermore, the third subset of plate members may comprises any number of plate members and not only a single plate member 45f as shown in FIG. 14B. Further still, the plurality of plate members may be arranged in any configuration, and need not be linearly arranged along the movement direction as illustrated. For example, the first subset, second subset, and/or third subset of plate members may comprise an array of N×M plate members, where N and M may be the same or different integers of plate members.

The partition wall 4 of FIGS. 14A and 14B may be implemented in any of the preceding embodiments, for example, as first partition wall 44a and/or 44b of FIGS. 12-12D or any other example described herein.

Various implementations of the ion beam apparatus disclosed herein may also include various components for controlling and operating the ion beam apparatus. Example components include, but are not limited to, electrical wires for supplying power and/or signals to the transport mechanism and/or wafer support mechanism, conduits or tubes for supplying cooling liquids and/or gases (e.g., water and the like), sensors for detecting parameters within the chamber 10 (e.g., temperature sensors, pressure sensors, radiation sensors, or the like), etc. In some embodiments, ions from the ion beam may be reflected from the wafer and dispersed about the chamber 10 or particles generated by the transport mechanism may be dispersed about the chamber 10, either of which may impact and/or damage the components. Accordingly, the partition wall 4 may be arranged to protect these components from particles and ions dispersed in the chamber. In some embodiments, an additional stage member is arranged to protect the components so as to substantially encompass and protect the components. Thus, one or more of the partition wall and stage member may be arranged to prevent and/or minimize damage to the components from ions from the ion beam and/or particles generated by the transport mechanism.

FIG. 15 illustrates a side view of an example configuration of the partition wall and a stage member in a variant example embodiment as viewed in the direction of movement. As described herein, chamber 10 comprises an upper chamber 11 housing the wafer support mechanism 2 and a lower chamber 12 housing the transport mechanism 3. The chamber 10 is separated by a partition wall 4 having an aperture 4a formed therein for moving the wafer supporting mechanism 2 along the direction of movement as described in connection to the various embodiments provided herein. As used herein, partition wall 4 may refer to any embodiment of partition wall described in the present disclosure, for example, partition 4 implemented as cover 320, wall portion 230, an independent partition wall 4, first and/or second partition wall 44a and 44b, etc.

FIG. 15 also illustrates a plurality of components 55a-55c positioned under the partition wall 4 along the X direction. By placing the components 55a-55c under the partition wall 4, the partition wall prevents and/or minimizes ions from the ion beam dispersed in the chamber 10 from impacting to the components 55a-55c. Each of components 55a-55c may be the same or different types of components. Furthermore, there may be fewer or more components than 55a-55c, for example, as many components as needed to operate the ion beam apparatus. In the illustrated embodiment of FIG. 15, the partition wall 4 is optionally L-shaped, such that partition wall 4 comprises a horizontally extending wall portion 46 (e.g., extending the Z direction) and a vertically extending wall portion 47 (e.g., extending in the X direction). The wall portion 47 may extend from the partition wall 46 toward the lower chamber 12. The wall portion 47 may provide additional protection of the components from adhesion by the ions in chamber 10. Where the partition wall comprises a plurality of plate members, as in FIGS. 14A and 14B, one or more of the plate members may be L-shaped. For example, the plate members neighboring the aperture 4a may comprise the wall portion 47, such that the wall portion 47 is positioned between the aperture 4a and the components 55a-55c.

While FIG. 15 illustrates L-shaped partitions wall 4 on both sides of wafer W, it will be appreciated that embodiments herein provide for one side having an L-shaped partition wall 4 while the other is planar shaped (e.g., comprising only portion 46). For example, the partition wall on the side of wafer W incident with the ion beam may include an L-shaped partition wall as illustrated while the opposite side partition wall 4 includes only portion 46, or vice versa.

FIG. 15 also illustrates optional stage members 50a and 50b positioned under the partition wall 4, having the components 55a-55c between stage members 50a and 50b and the partition wall 4. Stage members 50a and 50b are arranged to prevent and/or minimize damage due to ions from ion beam and/or particles generated by the transport mechanism 3 on the components 55a-55c. In some embodiments, the stage members 50a and/or 50b may be U-shaped or L-shaped having a vertically extending portion between the components 55a-55c and the aperture 4a. In some embodiments where partition wall 4 is L-shaped, the stage members 50a and 50b each comprise a vertically extending portion disposed between the components 55a-55c and the respective vertical portion 47; disposed between the respective vertical portion 47 and the aperture; or a combination thereof (e.g., stage member 50a having vertical portion between the vertical portion 47 and the components 55a, 55b and stage member 50b having vertical portion between vertical portion 47 and the aperture 4a, or vice versa). In various embodiments, the stage members 50a and 50b and partition wall 4 substantially encompass the components in a housing thereby preventing or minimizing particles and/or ions dispersed in chamber 10 from impacting and/or damaging the components 55a-55c.

In addition, it goes without saying that the present invention is not limited to the above-described embodiment and is susceptible to various modifications without departing from the spirit thereof.

What is claimed is:

1. An ion beam irradiation apparatus for irradiating a wafer with an ion beam, comprising:
    a chamber comprising an upper portion and a lower portion, the upper portion configured to irradiate the wafer with the ion beam and housing a wafer supporting mechanism configured to support the wafer, the lower portion housing a transport mechanism configured to move the wafer supporting mechanism in a substantially horizontal direction; and
    a partition wall disposed between the upper portion of the chamber and the lower portion of the chamber, the partition wall having:
        an aperture formed in the direction of movement of the transport mechanism and configured for moving the wafer supporting mechanism along with a coupling member coupling the wafer supporting mechanism to the transport mechanism,
        a plurality of plate members, each plate member provided independently from the upper portion and the lower portion of the chamber and independently from the other plate members, and each plate member is detachable from the upper portion and the lower portion of the chamber and detachable from the other plate members,
    wherein the transport mechanism comprises a movement guide mechanism laterally extending in the direction of movement of the transport mechanism and housed entirely within the lower portion, wherein the coupling member extends in a substantially vertical direction from the movement guide mechanism toward the aperture.

2. The ion beam irradiation apparatus according to claim 1, wherein the wafer supporting mechanism comprises:
    a wafer holding unit,
    wherein the wafer supporting mechanism is configured to provide a twist angle adjustment of the wafer holding unit around a central axis normal to a face of the wafer.

3. The ion beam irradiation apparatus according to claim 1, wherein the wafer supporting mechanism comprises:
    a wafer holding unit; and
    a loading angle adjustment mechanism configured to provide rotation of the wafer holding unit around a central axis parallel to a direction of movement of the transport mechanism.

4. The ion beam irradiation apparatus according to claim 3, wherein the central axis of the loading angle adjustment mechanism is parallel to a direction of movement of the transport mechanism when a tilt angle of the wafer holding unit is zero, and is not parallel when the tilt angle of the wafer holding unit is non-zero.

5. The ion beam irradiation apparatus according to claim 1, wherein the wafer supporting mechanism comprises:
    a wafer holding unit; and
    a tilt angle adjustment mechanism configured to provide rotation of the wafer holding unit around a central axis vertically perpendicular to a direction of movement of the transport mechanism.

6. The ion beam irradiation apparatus according to claim 5, wherein the tilt angle adjustment mechanism enables scanning of the wafer at an angle other than zero degrees with respect to the movement direction of the transport mechanism.

7. The ion beam irradiation apparatus according to claim 1, further comprising a venting mechanism that evacuates the chamber to a vacuum, wherein gas is exhausted at least from the lower portion of the chamber.

8. The ion beam irradiation apparatus according to claim 1, wherein the ion beam irradiation apparatus is equipped with an adhesion prevention unit comprising a shield plate that is provided between the partition wall and the wafer supported by the wafer supporting mechanism and connected to the coupling member, the adhesion prevention unit prevents particles generated by the transport mechanism from adhering to the wafer supported by the wafer supporting mechanism.

9. The ion beam irradiation apparatus according to claim 8, wherein the length dimensions of the shield plate in the direction of movement exceed the length dimensions of the wafer supported by the wafer supporting mechanism in the direction of movement.

10. The ion beam irradiation apparatus according claim 1, wherein the aperture has a cover member that covers at least a portion thereof on one or both sides in the direction of movement of the coupling member.

11. The ion beam irradiation apparatus according claim 1, wherein the partition wall comprises a first partition wall and a second partition wall separated by the aperture.

12. The ion beam irradiation apparatus according claim 1, wherein the partition wall comprises a single partition wall, and
wherein the aperture is formed in the single partition wall only in a region of movement of the coupling member of the transport mechanism.

13. The ion beam irradiation apparatus according claim 10, wherein the cover member is entirely within the upper portion.

14. The ion beam irradiation apparatus according claim 8, wherein the shield plate comprises a first plate that protrudes farther in a direction in which the ion beam is incident than the wafer and a second plate, at the distal end of the first plate, protruding in a direction away from the wafer and toward the partition wall.

15. The ion beam irradiation apparatus according to claim 14, wherein the length dimensions of the first and second plates in the direction of movement exceed the length dimensions of the wafer supported by the wafer supporting mechanism in the direction of movement.

16. The ion beam irradiation apparatus according claim 8, wherein adhesion prevention unit comprises at least one protrusion extending from the partition wall towards the wafer supported by the wafer supporting mechanism, the at least one protrusion disposed along a length of the aperture in the direction of movement.

17. The ion beam irradiation apparatus according claim 1, further comprising a plurality of components positioned underneath the partition wall along the vertical direction.

18. The ion beam irradiation apparatus according claim 17, wherein at least one plate member of the partition wall is L-shaped having a portion extending vertically toward the chamber lower portion and positioned between the components and the aperture.

* * * * *